(12) United States Patent
Lan et al.

(10) Patent No.: US 10,002,700 B2
(45) Date of Patent: Jun. 19, 2018

(54) VERTICAL-COUPLING TRANSFORMER WITH AN AIR-GAP STRUCTURE

(71) Applicant: QUALCOMM Incorporated, San Diego, CA (US)

(72) Inventors: Je-Hsiung Lan, San Diego, CA (US); Chi Shun Lo, San Diego, CA (US); Jonghae Kim, San Diego, CA (US); John H. Hong, San Clemente, CA (US)

(73) Assignee: QUALCOMM Incorporated, San Diego, CA (US)

( * ) Notice: Subject to any disclaimer, the term of this patent is extended or adjusted under 35 U.S.C. 154(b) by 41 days.

(21) Appl. No.: 13/778,191

(22) Filed: Feb. 27, 2013

(65) Prior Publication Data

US 2014/0240072 A1  Aug. 28, 2014

(51) Int. Cl.
| | |
|---|---|
| *H01F 5/00* | (2006.01) |
| *H01F 27/28* | (2006.01) |
| *H01F 19/00* | (2006.01) |
| *H01F 41/04* | (2006.01) |
| *H01L 49/02* | (2006.01) |
| *H01L 23/522* | (2006.01) |

(Continued)

(52) U.S. Cl.
CPC ............. *H01F 19/00* (2013.01); *H01F 5/003* (2013.01); *H01F 27/2804* (2013.01); *H01F 41/041* (2013.01); *H01L 23/5227* (2013.01); *H01L 28/10* (2013.01); *H01F 2027/2809* (2013.01); *H01L 2924/0002* (2013.01); *H05K 1/144* (2013.01); *H05K 3/3436* (2013.01); *H05K 2201/041* (2013.01); *H05K 2201/0723* (2013.01); *Y10T 29/4902* (2015.01)

(58) Field of Classification Search
CPC ................................................ H01F 2027/2809
See application file for complete search history.

(56) References Cited

U.S. PATENT DOCUMENTS

| | | |
|---|---|---|
| 3,798,059 A | 3/1974 | Astle et al. |
| 4,815,128 A | 3/1989 | Malek |
| 4,816,784 A | 3/1989 | Rabjohn |

(Continued)

FOREIGN PATENT DOCUMENTS

| | | |
|---|---|---|
| CN | 1628360 A | 6/2005 |
| CN | 1893071 A | 1/2007 |

(Continued)

OTHER PUBLICATIONS

Chien-Hsun Chen et al., "Very Compact Transformer-Coupled Balun-Integrated Bandpass Filter Using Integrated Passive Device Technology on Glass Substrate", Microwave Symposium Digest (MTT), 2010 IEEE MTT-S International, May 23-28, 2010, pp. 1372-1375.

(Continued)

*Primary Examiner* — Ronald Hinson
(74) *Attorney, Agent, or Firm* — Qualcomm Incorporated-Toler

(57) ABSTRACT

In a particular embodiment, a device includes a low-loss substrate, a first inductor structure, and an air-gap. The first inductor structure is between the low-loss substrate and a second inductor structure. The first inductor structure is aligned with the second inductor structure to form a transformer. The air-gap is between the first inductor structure and the second inductor structure.

38 Claims, 19 Drawing Sheets

(51) Int. Cl.
*H05K 1/14* (2006.01)
*H05K 3/34* (2006.01)

(56) References Cited

U.S. PATENT DOCUMENTS

| | | | |
|---|---|---|---|
| 4,841,253 A | 6/1989 | Crabill | |
| 5,015,972 A | 5/1991 | Cygan et al. | |
| 5,038,104 A | 8/1991 | Wikswo, Jr. et al. | |
| 5,095,357 A | 3/1992 | Andoh et al. | |
| 5,111,169 A | 5/1992 | Ikeda | |
| 5,161,082 A | 11/1992 | Alfonso | |
| 5,719,073 A | 2/1998 | Shaw et al. | |
| 5,831,331 A | 11/1998 | Lee | |
| 5,959,846 A | 9/1999 | Noguchi et al. | |
| 5,986,617 A | 11/1999 | McLellan | |
| 6,025,261 A | 2/2000 | Farrar et al. | |
| 6,169,470 B1 | 1/2001 | Ibata et al. | |
| 6,429,763 B1 | 8/2002 | Patel et al. | |
| 6,437,965 B1 | 8/2002 | Adkins et al. | |
| 6,466,768 B1 | 10/2002 | Agahi-Kesheh et al. | |
| 6,501,363 B1* | 12/2002 | Hwu | H01F 27/2804 29/602.1 |
| 6,580,350 B1 | 6/2003 | Kobayashi | |
| 6,603,382 B1 | 8/2003 | Komai et al. | |
| 6,649,998 B2 | 11/2003 | Song | |
| 6,714,112 B2 | 3/2004 | Beng et al. | |
| 6,801,114 B2 | 10/2004 | Yang et al. | |
| 6,816,784 B1 | 11/2004 | Khan et al. | |
| 6,870,457 B2 | 3/2005 | Chen et al. | |
| 6,985,035 B1 | 1/2006 | Khorramabadi | |
| 6,990,729 B2 | 1/2006 | Pleskach et al. | |
| 7,064,411 B2 | 6/2006 | Hashizume et al. | |
| 7,304,558 B1 | 12/2007 | Pleskach et al. | |
| 7,312,685 B1 | 12/2007 | Lee | |
| 7,370,403 B1 | 5/2008 | Hsu et al. | |
| 7,486,168 B2 | 2/2009 | Kim | |
| 7,526,256 B2 | 4/2009 | Bhatti et al. | |
| 7,570,129 B2* | 8/2009 | Kintis | H01P 5/10 333/25 |
| 7,592,891 B2 | 9/2009 | Hsu et al. | |
| 7,616,934 B2 | 11/2009 | MacPhail | |
| 7,619,297 B2 | 11/2009 | Wang | |
| 7,808,358 B2 | 10/2010 | Nakamura et al. | |
| 7,894,205 B2 | 2/2011 | Lee et al. | |
| 8,013,708 B2 | 9/2011 | Tsai | |
| 8,045,946 B2 | 10/2011 | Roo et al. | |
| 8,229,367 B2 | 7/2012 | Chan et al. | |
| 8,233,870 B2 | 7/2012 | Walley et al. | |
| 8,339,233 B2 | 12/2012 | Tsai et al. | |
| 8,354,325 B1 | 1/2013 | Dao et al. | |
| 8,368,481 B2 | 2/2013 | Jin et al. | |
| 8,493,126 B2 | 7/2013 | Sankaranarayanan et al. | |
| 8,591,262 B2 | 11/2013 | Schaffer et al. | |
| 9,001,031 B2 | 4/2015 | Lo et al. | |
| 2002/0057176 A1 | 5/2002 | Norstrom et al. | |
| 2002/0113682 A1 | 8/2002 | Gevorgian et al. | |
| 2002/0132383 A1 | 9/2002 | Hiroki et al. | |
| 2003/0151485 A1 | 8/2003 | Lewis | |
| 2004/0012474 A1 | 1/2004 | Hwu et al. | |
| 2004/0090298 A1 | 5/2004 | Masu et al. | |
| 2004/0104449 A1 | 6/2004 | Yoon et al. | |
| 2004/0150502 A1 | 8/2004 | Jacobson et al. | |
| 2004/0207504 A1 | 10/2004 | Yang et al. | |
| 2005/0104158 A1 | 5/2005 | Bhattacharjee et al. | |
| 2006/0017539 A1* | 1/2006 | Lee | H01F 17/0006 336/200 |
| 2006/0284719 A1 | 12/2006 | Lee | |
| 2007/0008058 A1 | 1/2007 | Hashimoto | |
| 2007/0030116 A1 | 2/2007 | Feher | |
| 2007/0152298 A1 | 7/2007 | Kim | |
| 2007/0176845 A1 | 8/2007 | Yamazaki et al. | |
| 2007/0188997 A1 | 8/2007 | Hockanson et al. | |
| 2007/0247269 A1 | 10/2007 | Papananos | |
| 2007/0249078 A1 | 10/2007 | Tung et al. | |
| 2008/0037590 A1 | 2/2008 | Aiga et al. | |
| 2008/0076354 A1 | 3/2008 | Rofougaran | |
| 2008/0169895 A1 | 7/2008 | Lee | |
| 2008/0174386 A1 | 7/2008 | Ono et al. | |
| 2008/0174396 A1* | 7/2008 | Choi | H01F 27/2804 336/182 |
| 2008/0174397 A1 | 7/2008 | De Rooij et al. | |
| 2008/0246114 A1 | 10/2008 | Abrokwah et al. | |
| 2008/0272875 A1 | 11/2008 | Huang et al. | |
| 2008/0303622 A1 | 12/2008 | Park et al. | |
| 2009/0001510 A1 | 1/2009 | Matz et al. | |
| 2009/0072404 A1 | 3/2009 | Kikuchi et al. | |
| 2009/0085708 A1 | 4/2009 | Matsumoto et al. | |
| 2009/0134955 A1 | 5/2009 | Sheng et al. | |
| 2009/0146770 A1 | 6/2009 | Lee et al. | |
| 2009/0243389 A1 | 10/2009 | Edo et al. | |
| 2009/0243749 A1* | 10/2009 | Rofougaran | H01P 5/10 333/25 |
| 2009/0322447 A1 | 12/2009 | Daley et al. | |
| 2010/0060402 A1 | 3/2010 | Chen | |
| 2010/0096753 A1 | 4/2010 | Hwang et al. | |
| 2010/0109123 A1 | 5/2010 | Strzalkowski et al. | |
| 2010/0148866 A1 | 6/2010 | Lee et al. | |
| 2010/0164667 A1 | 7/2010 | Ho-Hsiang | |
| 2010/0182118 A1* | 7/2010 | Roskos | H01F 17/02 336/200 |
| 2010/0225435 A1 | 9/2010 | Li et al. | |
| 2010/0231305 A1 | 9/2010 | Mizokami et al. | |
| 2010/0260082 A1 | 10/2010 | Lum et al. | |
| 2010/0270947 A1 | 10/2010 | Chang et al. | |
| 2011/0018670 A1 | 1/2011 | Bae et al. | |
| 2011/0050357 A1 | 3/2011 | Kim et al. | |
| 2011/0102124 A1 | 5/2011 | Matsushita | |
| 2011/0133875 A1 | 6/2011 | Chiu et al. | |
| 2011/0133879 A1 | 6/2011 | Chiu et al. | |
| 2011/0168997 A1 | 7/2011 | Lee et al. | |
| 2011/0210804 A1 | 9/2011 | Uemichi et al. | |
| 2011/0217657 A1 | 9/2011 | Flemming et al. | |
| 2011/0221560 A1 | 9/2011 | Chen et al. | |
| 2011/0229667 A1 | 9/2011 | Jin et al. | |
| 2011/0229687 A1 | 9/2011 | Gu et al. | |
| 2011/0234469 A1 | 9/2011 | Shoji | |
| 2011/0245948 A1 | 10/2011 | Bai et al. | |
| 2011/0291786 A1 | 12/2011 | Li et al. | |
| 2011/0299431 A1 | 12/2011 | Mikhemar et al. | |
| 2011/0299435 A1 | 12/2011 | Mikhemar et al. | |
| 2011/0304013 A1 | 12/2011 | Chen et al. | |
| 2012/0058676 A1 | 3/2012 | Schaffer et al. | |
| 2012/0075216 A1 | 3/2012 | Black et al. | |
| 2012/0146741 A1 | 6/2012 | Yen et al. | |
| 2012/0188047 A1 | 7/2012 | Groves et al. | |
| 2012/0194403 A1 | 8/2012 | Cordier et al. | |
| 2012/0235779 A1 | 9/2012 | Baram et al. | |
| 2012/0235969 A1 | 9/2012 | Burns et al. | |
| 2012/0238331 A1 | 9/2012 | Dou et al. | |
| 2012/0244802 A1 | 9/2012 | Feng et al. | |
| 2012/0249186 A1 | 10/2012 | Chen | |
| 2012/0249281 A1 | 10/2012 | Campbell et al. | |
| 2012/0293485 A1 | 11/2012 | Chang et al. | |
| 2012/0299166 A1 | 11/2012 | Minamio et al. | |
| 2013/0016633 A1 | 1/2013 | Lum et al. | |
| 2013/0039229 A1 | 2/2013 | Park et al. | |
| 2013/0050226 A1 | 2/2013 | Shenoy et al. | |
| 2013/0057343 A1 | 3/2013 | Kondo | |
| 2013/0057557 A1 | 3/2013 | Shenoy et al. | |
| 2013/0106554 A1 | 5/2013 | Girard et al. | |
| 2013/0157717 A1 | 6/2013 | Yu et al. | |
| 2013/0207276 A1 | 8/2013 | Tseng et al. | |
| 2013/0207739 A1 | 8/2013 | Bakalski | |
| 2013/0207745 A1 | 8/2013 | Yun et al. | |
| 2013/0257367 A1 | 10/2013 | Someya | |
| 2013/0278374 A1* | 10/2013 | Thorslund | H01F 27/2804 336/200 |
| 2014/0138792 A1 | 5/2014 | Lo et al. | |
| 2014/0145810 A1 | 5/2014 | Park et al. | |
| 2014/0197902 A1 | 7/2014 | Zuo et al. | |
| 2014/0225702 A1 | 8/2014 | Yazaki | |
| 2014/0227982 A1 | 8/2014 | Granger-Jones et al. | |
| 2014/0266494 A1 | 9/2014 | Lan et al. | |
| 2014/0293841 A1 | 10/2014 | Rousu | |

(56) References Cited

U.S. PATENT DOCUMENTS

| | | |
|---|---|---|
| 2014/0307599 A1 | 10/2014 | Rousu |
| 2014/0327510 A1 | 11/2014 | Kim et al. |
| 2015/0061813 A1 | 3/2015 | Kim et al. |
| 2015/0092314 A1 | 4/2015 | Kim |
| 2015/0130579 A1 | 5/2015 | Kim et al. |
| 2015/0194944 A1 | 7/2015 | Josh et al. |
| 2015/0304059 A1 | 10/2015 | Zuo |
| 2016/0358709 A1 | 12/2016 | Kim et al. |
| 2017/0134007 A1 | 5/2017 | Lan et al. |

FOREIGN PATENT DOCUMENTS

| | | |
|---|---|---|
| CN | 101213142 A | 7/2008 |
| CN | 101241916 A | 8/2008 |
| CN | 201156721 Y | 11/2008 |
| CN | 101673864 A | 3/2010 |
| CN | 102725844 A | 10/2010 |
| CN | 101960573 A | 1/2011 |
| CN | 102231313 A | 11/2011 |
| CN | 102522181 A | 6/2012 |
| CN | 102739229 A | 10/2012 |
| CN | 203942319 U | 11/2014 |
| EP | 0468757 A2 | 1/1992 |
| EP | 0995264 A1 | 4/2000 |
| EP | 1085538 A1 | 3/2001 |
| EP | 1443529 A1 | 8/2004 |
| EP | 1729413 A1 | 12/2006 |
| JP | H0832076 A | 2/1996 |
| JP | H08148354 A | 6/1996 |
| JP | H11204730 A | 7/1999 |
| JP | 2000114046 A | 4/2000 |
| JP | 2000286125 | 10/2000 |
| JP | 2002152901 A | 5/2002 |
| JP | 2003031814 A | 1/2003 |
| JP | 2003318417 A | 11/2003 |
| JP | 2004235584 A | 8/2004 |
| JP | 2005032976 A | 2/2005 |
| JP | 2005223261 A | 8/2005 |
| JP | 2006054446 A | 2/2006 |
| JP | 2009508322 A | 2/2009 |
| JP | 2009071045 A | 4/2009 |
| JP | 2010098199 A | 4/2010 |
| JP | 2010141246 A | 6/2010 |
| JP | 2012058274 A | 3/2012 |
| JP | 2012074060 A | 4/2012 |
| JP | 2012164770 A | 8/2012 |
| KR | 20080031153 A | 4/2008 |
| KR | 20080069823 A | 7/2008 |
| KR | 101127478 B1 | 3/2012 |
| KR | 20130072284 A | 7/2013 |
| KR | 20130098099 A | 9/2013 |
| WO | 02080279 A1 | 10/2002 |
| WO | 2012093133 A1 | 7/2012 |
| WO | 2013033124 A1 | 3/2013 |

OTHER PUBLICATIONS

Fu et al., "A Ferroelectric-Based Impedance Tuner for Adaptive Matching Applications", Microwave Symposium Digest, 2008 IEEE MTT-S International, Jun. 15-20, 2008, pp. 955-958.

Mikhemar, et al., "An On-Chip Wideband and Low-Loss Duplexer for 3G/4G CMOS Radios," IEEE Symposium on VLSI Circuits 2010, pp. 129-130.

Mobley, T., et al., "Through Glass Via (TGV) Solutions for Wafer and Chip Level Interposers and RF Integration Methods for High Frequency Applications," Mar. 2012, nMode Solutions, Tucson, Arizona, 25 pages.

Orlandi, S., et al., "Optimization of shielded PCB air-core toroids for high efficiency dc-dc converters," Energy Conversion Congress and Exposition, Sep. 2009, IEEE, Piscataway, NJ, pp. 2073-2080.

Shorey, A., et al., "Development of Substrates Featuring Through Glass Vias (TGV) for 3D-IC Integration," Corning Incorporated, 2010, Corning, New York, pp. 1-3.

Töpper, M., et al., "3-D Film Interposer Based on TGV (Through Glass Vias): An Alternative to Si-Interposer," 2010 Electronic Components and Technology Conference, Jun. 2010, IEEE, Piscataway, NJ, pp. 66-73.

Yu, X., et al., "Silicon-Embedding Approaches to 3-D Toroidal Inductor Fabrication," Journal of Microelectromechanical Systems, Jun. 2013, vol. 22, No. 3, IEEE, Piscataway, NJ, pp. 580-588.

International Search Report and Written Opinion for International Application No. PCT/US2014/016707, ISA/EPO, dated May 14, 2014, 12 pages.

Mikhemar, M., et al., "A Tunable Integrated Duplexer with 50dB Isolation in 40nm CMOS," 2009 IEEE International Solid-State Circuits Conference (ISSCC)—Digest Of Technical Papers, Feb. 2009, IEEE, Piscataway, New Jersey, pp. 386-387.

Yoon, Y., et al., "Design and Characterization of Multilayer Spiral Transmission-Line Baluns," IEEE Transactions on Microwave Theory and Techniques, Sep. 1999, vol. 47, No. 9, IEEE, Piscataway, New Jersey, pp. 1841-1847.

Bae, H., et al., "Extraction of Separated Source and Drain Resistances in Amorphous Indium-Gallium-Zinc Oxide TFTs Through C—V Characterization," IEEE Electron Device Letters, Jun. 2011, vol. 32, No. 6, IEEE, Piscataway, NJ, pp. 761-763.

Saputra, N., et al., "Single-Grain Si Thin-Film Transistors for Analog and RF Circuit Applications," Solid State Device Research Conference, 2007 . ESSDERC. 37th European, Sep. 2007, IEEE, Piscataway, NJ, pp. 107-110.

Bhattacharya S.K., et al., "Fabrication of a Fully Integrated Passive Module for Filter Application Using Mcm-d Compatible Processes", Journal of Materials Science: Materials in Electronics, 2000, pp. 455-460.

Liu L., et al., "Compact Harmonic Filter Design and Fabrication Using IPD Technology", IEEE Transactions on components and packaging technologies, vol. 30 (4), 2007, pp. 556-562.

* cited by examiner

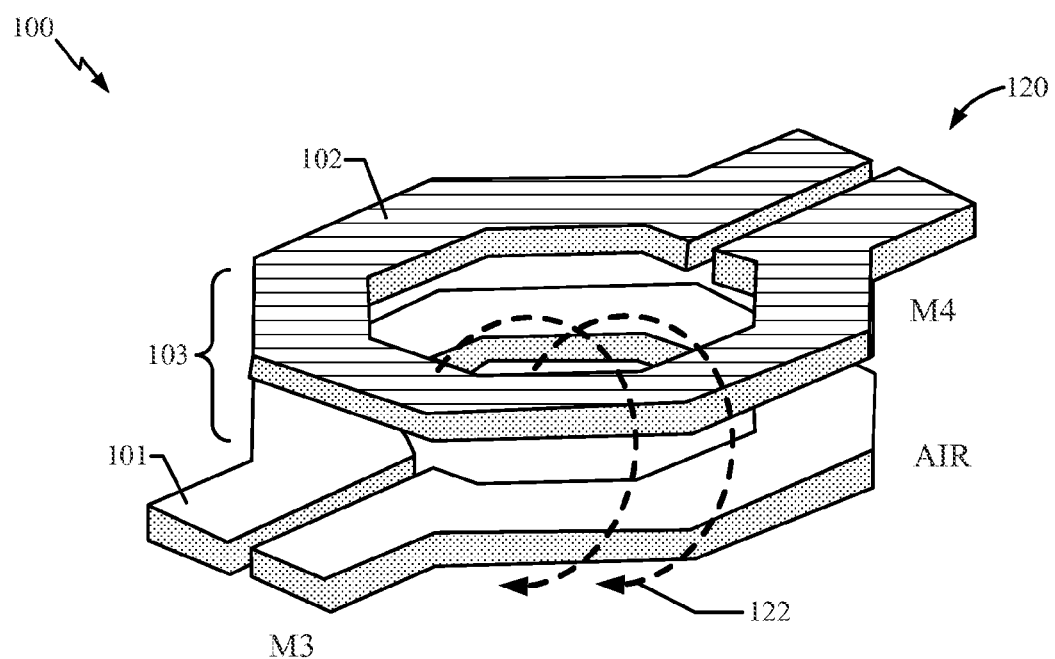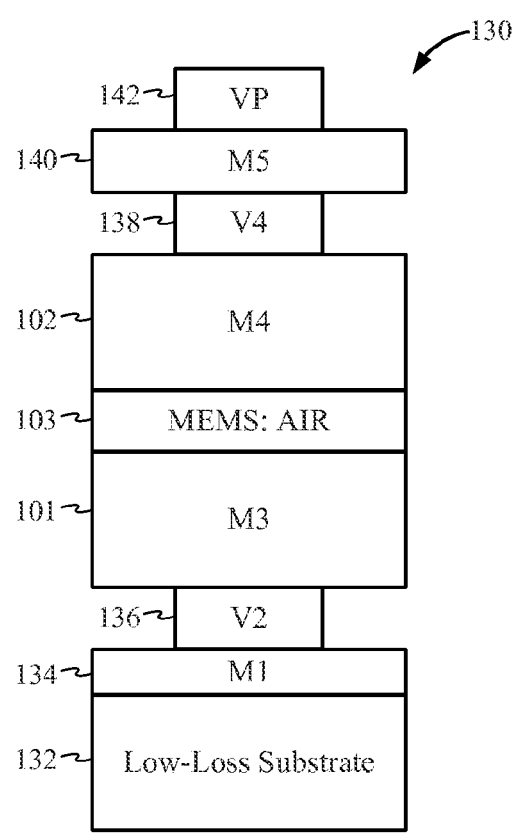
FIG. 1

1700

1702

Form inductor structures, where each of the inductor structures includes a first inductor and a second inductor, where the first inductor and the second inductor are proximate to each other, where the inductor structures are disposed in parallel, where the first inductor in a first inductor structure is connected with the first inductor in a second inductor structure, where the second inductor in the first inductor structure is connected with the second inductor in the second inductor structure, where the first inductor structure is between a low-loss substrate and the second inductor structure, and where the first inductor structure is aligned with the second inductor structure to form a transformer

1704

Form an air-gap between the first inductor structure and the second inductor structure

FIG. 17

VERTICAL-COUPLING TRANSFORMER WITH AN AIR-GAP STRUCTURE

I. FIELD

The present disclosure is generally related to transformers in semiconductor devices.

II. DESCRIPTION OF RELATED ART

Wireless communication technology has made significant impacts on our society. Numerous technical breakthroughs have helped advance wireless communications. One of the technical breakthroughs is in semiconductor manufacturing processes that enable integration of a large number of microelectronic devices on a semiconductor integrated circuit (IC). Such semiconductor manufacturing technology has helped reduce costs associated with manufacturing wireless communication products.

Complementary-Metal-Oxide-Semiconductor (CMOS) manufacturing technology is typically used in manufacturing wireless communication ICs. Since modern radio-frequency (RF) duplexers use frequency-selective filters for transmit-receive (TX-RX) isolation, the high isolation requirement prevents integration of the RF off-chip duplexers with CMOS technology. Currently, Surface Acoustic Wave (SAW) technology and Film Bulk Acoustic Resonator (FBAR) technology are the predominant duplexer technologies due to their TX-RX isolation. However, SAW and FBAR technologies result in relatively large module sizes and higher costs as compared to other technologies.

III. SUMMARY

This disclosure presents particular embodiments of a vertical-coupling transformer with an air-gap between two vertical-coupling inductors. Use of the vertical coupling transformer with the air-gap in a wireless communications device (e.g., a RF duplexer) may improve TX-RX isolation and ANT-RX signaling coupling, and may reduce the ANT-RX insertion loss and the TX-ANT insertion loss associated with the wireless communications device.

In a particular embodiment, a device includes a low-loss substrate, a first inductor structure, and an air-gap. The first inductor structure is between the low-loss substrate and a second inductor structure. The first inductor structure is aligned with the second inductor structure to form a transformer. The air-gap is between the first inductor structure and the second inductor structure.

In another particular embodiment, a device includes a low-loss substrate (e.g. a dielectric substrate or a semiconductor substrate) and inductor structures. Each of the inductor structures includes a first inductor and a second inductor. The first inductor and the second inductor are proximate to each other. The inductor structures are disposed in parallel. A first inductor structure is between a second inductor structure and the low-loss substrate. The first inductor structure is aligned with the second inductor structure to form a transformer. The first inductor in the first inductor structure is connected to the first inductor in the second inductor structure. The second inductor in the first inductor structure is connected with the second inductor in the second inductor structure. An air-gap is between the first inductor structure and the second inductor structure.

In another particular embodiment, a method includes forming a first inductor structure and forming a second inductor structure. The first inductor structure is between a low-loss substrate and the second inductor structure. The first inductor structure is aligned with the second inductor structure to form a transformer. The method also includes forming an air-gap between the first inductor structure and the second inductor structure.

In another particular embodiment, a method includes forming inductor structures. Each of the inductor structures includes a first inductor and a second inductor. The first inductor and the second inductor are proximate to each other. The inductor structures are disposed in parallel. The first inductor in a first inductor structure is connected with the first inductor in a second inductor structure. The second inductor in the first inductor structure is connected with the second inductor in the second inductor structure. The first inductor structure is between a low-loss substrate and the second inductor structure. The first inductor structure is aligned with the second inductor structure to form a transformer. The method also includes forming an air-gap between the first inductor structure and the second inductor structure.

In another particular embodiment, a computer-readable storage device stores instructions that, when executed by a processor cause the processor to perform operations including forming a first inductor structure and forming a second inductor structure. The first inductor structure is between a low-loss substrate and the second inductor structure. The first inductor structure is aligned with the second inductor structure to form a transformer. The method also includes forming an air-gap between the first inductor structure and the second inductor structure.

In another particular embodiment, a method includes a step for forming a first inductor structure. The method also includes a step for forming a second inductor structure. The first inductor structure is between a low-loss substrate and the second inductor structure. The first inductor structure is aligned with the second inductor structure to form a transformer. The method also includes a step for forming an air-gap between the first inductor structure and the second inductor structure.

One particular advantage provided by at least one of the disclosed embodiments, as compared to a vertical transformer without an air-gap, is enhanced performance, such as when implemented in a RF duplexer configuration. For example, TX-RX isolation may be improved due to reduced parasitic capacitance coupling between input inductors and output inductors, ANT-RX signal coupling may be improved due to reduction of the gap width between the input inductors and the output inductors, and ANT-RX insertion loss and TX-ANT insertion loss may be reduced because the air-gap may function as a very low-loss or no-loss dielectric material.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

FIG. 1 is a diagram showing a particular embodiment of a vertical-coupling transformer (VHT) with an air-gap structure in a passive-on-glass configuration (POG);

FIG. 17 is a flow chart of another particular illustrative embodiment of a method of forming a VHT with an air-gap structure;

V. DETAILED DESCRIPTION

Figure 2:
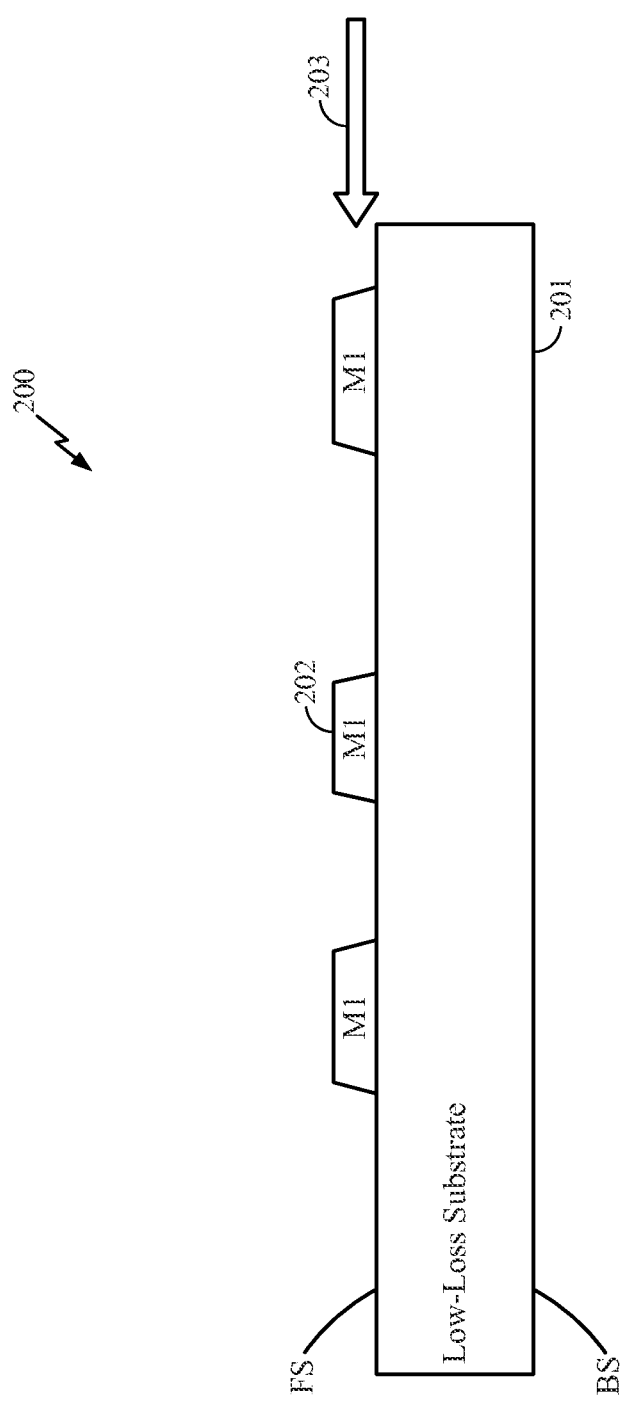
FIG. 2 is a diagram of a particular embodiment of a stage of forming a VHT with an air-gap structure including forming connectors on a low-loss (e.g., dielectric or semiconductor) substrate.

FIG. 1 is a diagram showing a perspective view of a vertical-coupling transformer (VHT) 120 with an air-gap structure in a passive-on-glass (POG) configuration. The diagram also shows a cross-sectional view 130 of a POG VHT. Particular embodiments of a POG VHT with an air-gap structure and methods of fabrication are presented in details in this disclosure. It should be appreciated, however, that the concepts and insights used in the particular embodiments with respect to designs of the device and with respect to how to make the device may be embodied in a variety of contexts. The particular embodiments presented are merely illustrative of specific ways to design and make the device, and do not limit the scope of this disclosure.

The present disclosure describes the particular embodiments in specific contexts, such as designs of a VHT with air-gap device and methods of making the device in a POG configuration. However, features, methods, structures or characteristics described according to the particular embodiments may also be combined in suitable manners to form one or more other embodiments. In addition, figures are drawn to the extent that they are used to illustrate the relative relationships between the features, methods, structures, or characteristics, and thus may not be drawn in scale.

The POG VHT 120 includes a lower inductor 101, an upper inductor 102, and an air-gap 103 between the lower inductor 101 and the upper inductor 102. The lower inductor 101 may generate a magnetic field 122 (e.g., in response to a current being applied to the lower inductor 101). The upper inductor 102 may generate another current in response to the magnetic field 122.

The cross-sectional view 130 of the POG VHT 120 includes a low-loss material as a substrate 132, which may be made of glass material with high electrical resistivity. The POG VHT 130 includes a metal connector 134 a first distance from a surface of the substrate 132. The metal connector 134 (e.g., an M1 layer) may be utilized to connect with the lower inductor 101 (e.g., an M3 layer) via a conductive layer 136 (e.g., a via layer V2). The POG VHT 130 further includes the upper inductor 102 with the air-gap 103 between the lower inductor 101 and the upper inductor 102. There is another conductive layer 138 (e.g., a via layer V4) between the upper inductor 102 (e.g., an M4 layer) and another metal connector 140 (e.g., an M5 layer). The other metal connector 140 may be utilized to connect the upper inductor 102 to other circuitry or devices via a third conductive layer 142.

Having the air-gap structure instead of a material dielectric layer in a vertical transformer (e.g. the POG VHT 130) may reduce the parasitic capacitance coupling between input inductors (e.g., the lower inductor 101) and output inductors (e.g., the upper inductor 102) of a wireless communications device (e.g. a RF duplexer) that uses the vertical transformer. The reduced parasitic coupling may result in improved TX-RX isolation associated with the wireless communications device. In a particular embodiment, having the air-gap structure instead of the material dielectric layer may reduce a gap width between the input inductors and the output inductors resulting in improved ANT-RX signal coupling. In another particular embodiment, the air-gap structure may function as a lower-loss dielectric layer than a material dielectric layer, thereby reducing the ANT-RX insertion loss and the TX-ANT insertion loss associated with the wireless communications device.

FIG. 2 is a diagram illustrating a stage of forming a component in a POG VHT with an air-gap structure. The diagram shows a cross-sectional view of a portion of a wafer 200. The wafer 200 includes a low-loss (e.g., dielectric, wide-bandgap semiconductor, etc.) material as a substrate 201, which may be made of glass material. The low-loss material may include a dielectric material or a highly-insulative semiconductor material. Examples of the low-loss material include glass, quartz, sapphire, silicon-on-insulator substrate (SOI), Gallium Arsenide (GaAs), Indium phosphate (InP), silicon carbide (SiC), plastics, Rogers Laminates, silicon nitride, silicon oxynitride, ceramics, polymers, and epoxies. The thickness of the substrate 201 may be any suitable size that accommodates the following processes and packaging criteria. In a particular embodiment, the thickness may be about 0.7 millimeters (mm). In another particular embodiment, the thickness may be about 0.3 mm. In another particular embodiment, the thickness may be about 0.1 mm. In another particular embodiment, the thickness may range from about 0.1 mm to about 0.7 mm.

It is noted that in the particular embodiments of the present disclosure, film deposition processes, such as chemical vapor deposition (CVD), spin-on, sputtering, and/or electroplating may be used to form metal layers and inter-metal dielectric layers. Photolithography may be used to form patterns of metal layers. An etching process may be performed to remove unwanted materials. Planarization processes such as "etch-back" and chemical-mechanical polishing (CMP) may be employed to create a flat surface.

It is also noted that only a limited number of connectors, inductors, layers, and other structures or devices are shown in the figures of this disclosure for ease of illustration and clarity. Those of ordinary skill in the art will appreciate that, in practice, the wafer 200 may host a number of connectors, inductors, layers, and other structures or devices pursuant to design criteria. It is also noted that like numerals, letters, materials, functions, structures, and process flows may not be repeated in description and figures.

Metal connectors 202 may be formed on a surface of the substrate 201 to be utilized to connect with inductors. The connectors 202 may be formed by first depositing a conductive layer 203 on a front side (FS) of the substrate 201. Materials for the conductive layer 203 may include any conductive materials. In a particular embodiment, the conductive layer 203 is metal or metal alloy, such as aluminum-copper (Al—Cu) alloy. The thickness of the conductive layer 203 may include various thicknesses. In a particular embodiment, the thickness is about 1-3 micrometer (um). The conductive layer 203 may be formed through film deposition processes, such as physical vapor deposition (PVD) (e.g., sputtering) or chemical vapor deposition (CVD). Alternatively, the conductive layer 203 may be formed through an electroplating process. In a particular embodiment, the conductive layer 203 is made of copper (Cu) and is formed using an electroplating process or a CVD process to obtain a highly conductive and low-loss layer. A photolithography-etch process flow may be performed on the conductive layer 203 to form the patterned metal connectors 202.

Figure 3:
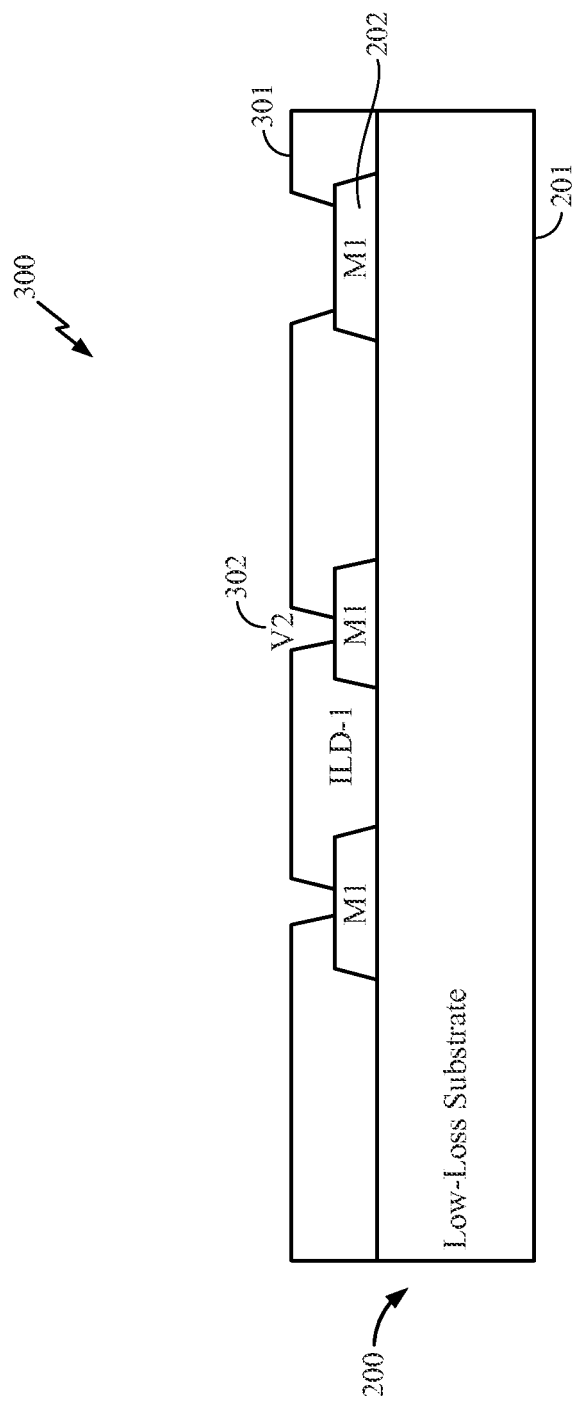
FIG. 3 is a diagram of a particular embodiment of a stage of forming a VHT with an air-gap structure including forming a dielectric layer and creating via holes.

As illustrated in a processing stage 300 in FIG. 3, a dielectric layer 301 may be subsequently formed over the substrate 201 to electrically insulate the metal connectors 202 from other circuitry or devices. The dielectric layer 301 may include silicon dioxide ($SiO_2$), silicon nitride ($Si_3N_4$), or insulating polymers (e.g. polyimide (PI), benzocyclobutene (BCB), acrylic, polybenzoxazole (PBO), or photoresist). In a particular embodiment, the thickness of the dielectric layer 301 is about 3 micrometers (um). An anisotropic etch process may be performed on the substrate 201 to create via holes 302 in the dielectric layer 301. In a particular embodiment, the depth of the via holes 302 is about 2 um.

Figure 4:
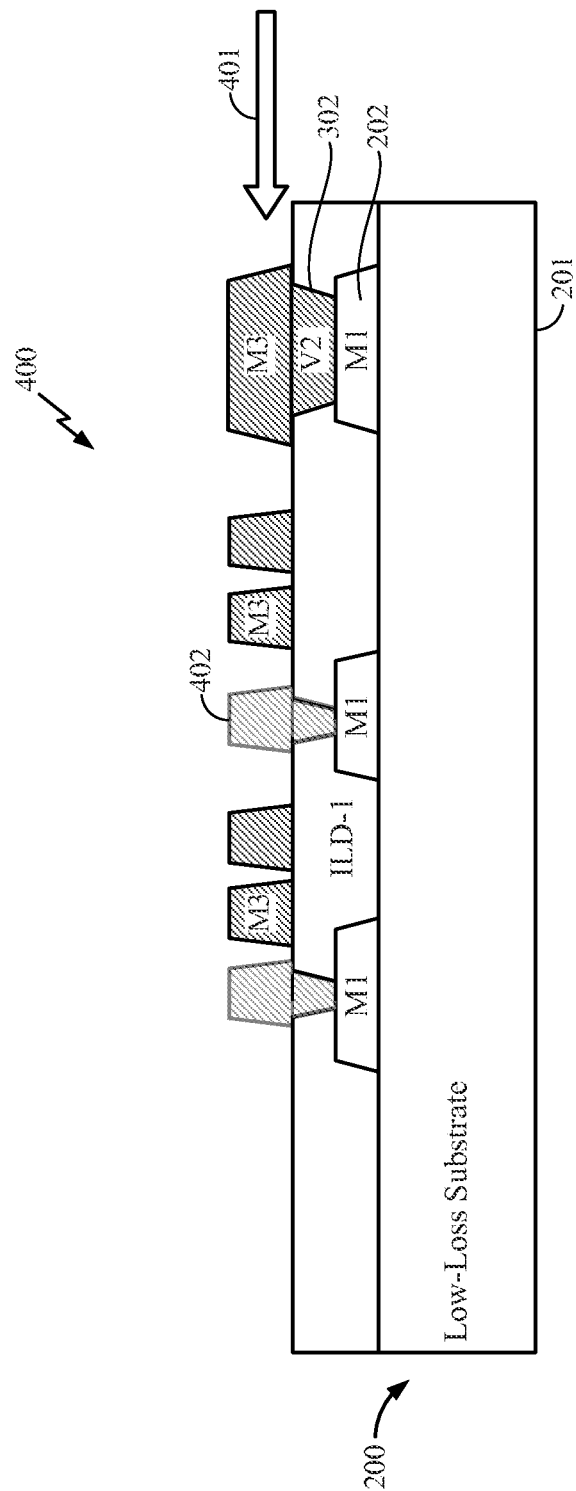
FIG. 4 is a diagram of a particular embodiment of a stage of forming a VHT with an air-gap structure including forming low inductors.

As illustrated in a processing stage 400 in FIG. 4, a conductive layer 401 may be deposited over the substrate 201 to form inductors 402. Materials for the conductive layer 401 may include any conductive materials suitable for making an RF inductor. In a particular embodiment, the conductive layer 401 is made of metal such as copper (Cu) or a metal alloy. The conductive layer 401 may be formed through film deposition processes, such as electroplating, sputtering PVD, or chemical vapor deposition (CVD). A photolithography-etch process flow may be performed on the conductor layer 401 to form patterned inductors 402. The inductors 402 illustrated in FIG. 4 may correspond to a cross-sectional view of the lower inductor 101 of FIG. 1.

Figure 5:
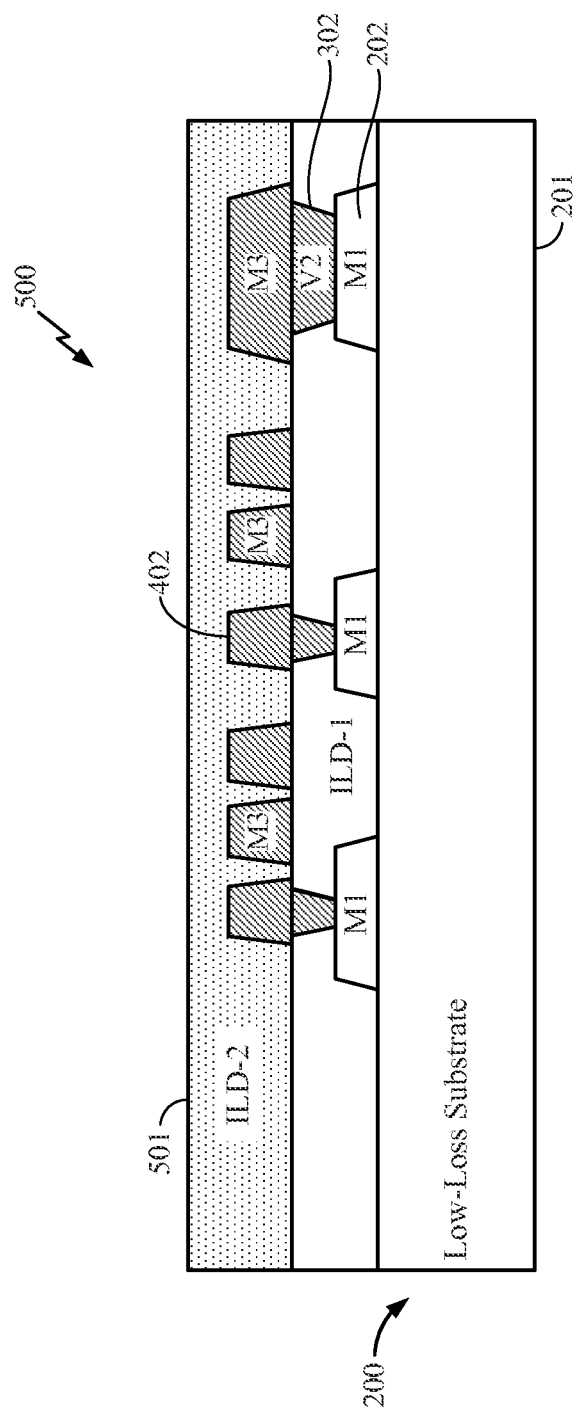
FIG. 5 is a diagram of a particular embodiment of a stage of forming a VHT with an air-gap structure including forming a dielectric layer.

As illustrated in a processing stage 500 in FIG. 5, a dielectric layer 501 may be subsequently deposited over the substrate 201 to insulate the inductors 402 from other circuitry or devices. Materials of the dielectric layer 501 may include silicon dioxide ($SiO_2$), silicon nitride ($Si_3N_4$), or insulating polymers (e.g., polyimide (PI), benzocyclobutene (BCB), acrylic, polybenzoxazole (PBO), or photoresist).

Figure 6:
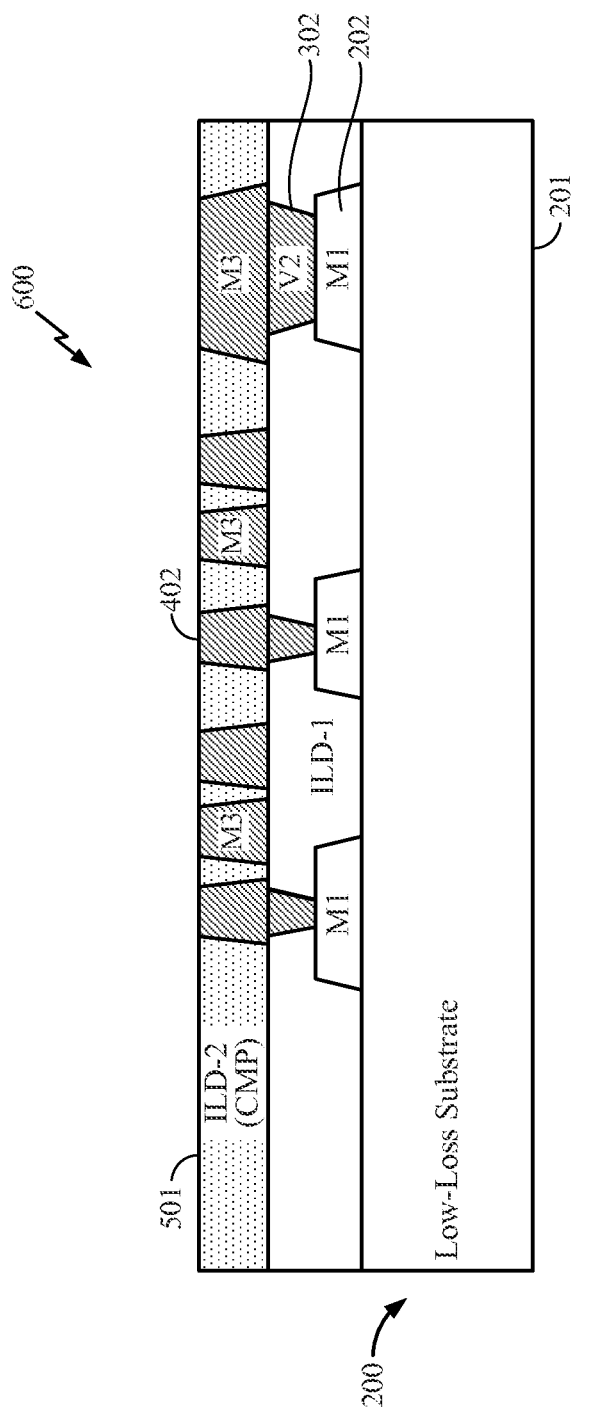
FIG. 6 is a diagram of a particular embodiment of a stage of forming a VHT with an air-gap structure including using a chemical-mechanical polish (CMP) planarization process to remove unwanted dielectric layer material.

As illustrated in a processing stage 600 in FIG. 6, a planarization process may be used to remove unwanted or excess dielectric layer materials, create a flat surface, and expose the inductors 402 for subsequent processing. Any suitable planarization process may be utilized in this stage. In a particular embodiment, the planarization process may include chemical mechanical polishing (CMP). In another particular embodiment, the planarization process may include an etch-back planarization process.

Figure 7:
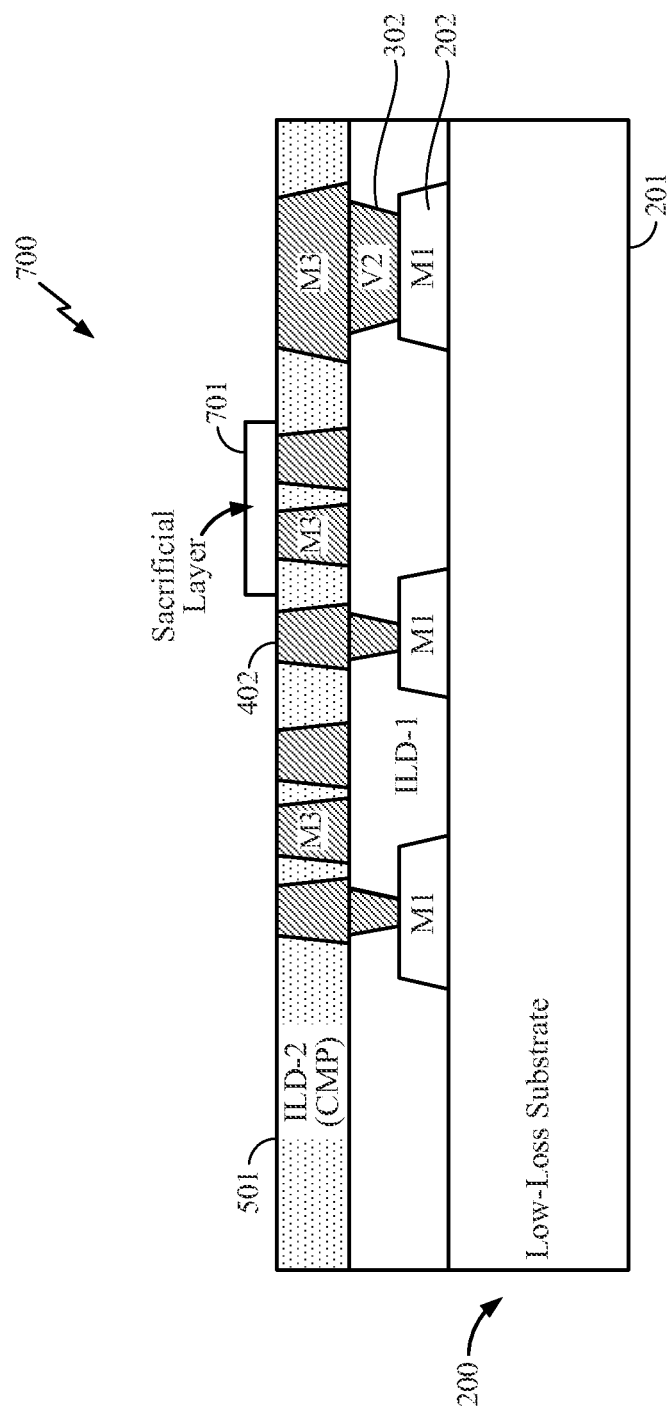
FIG. 7 is a diagram of a particular embodiment of a stage of forming a VHT with an air-gap structure including forming a sacrificial layer.

As illustrated in a processing stage 700 in FIG. 7, a sacrificial layer 701 may be subsequently deposited over the substrate 201 to be later removed to form an air-gap. A photolithography-etch process may be employed to pattern the sacrificial layer 701. Materials of the sacrificial layer 701 may be any materials which may be removed by processes during later procedures. In a particular embodiment, the sacrificial materials include Molybdenum (Mo), amorphous silicon (a-Si), poly-silicon, silicon dioxide ($SiO_2$), or SU-8 photoresist. In a particular embodiment, the thickness of the sacrificial layer 701 is about 5 um. In another particular embodiment, the thickness of the sacrificial layer 701 is approximately 3-10 um.

Figure 8:
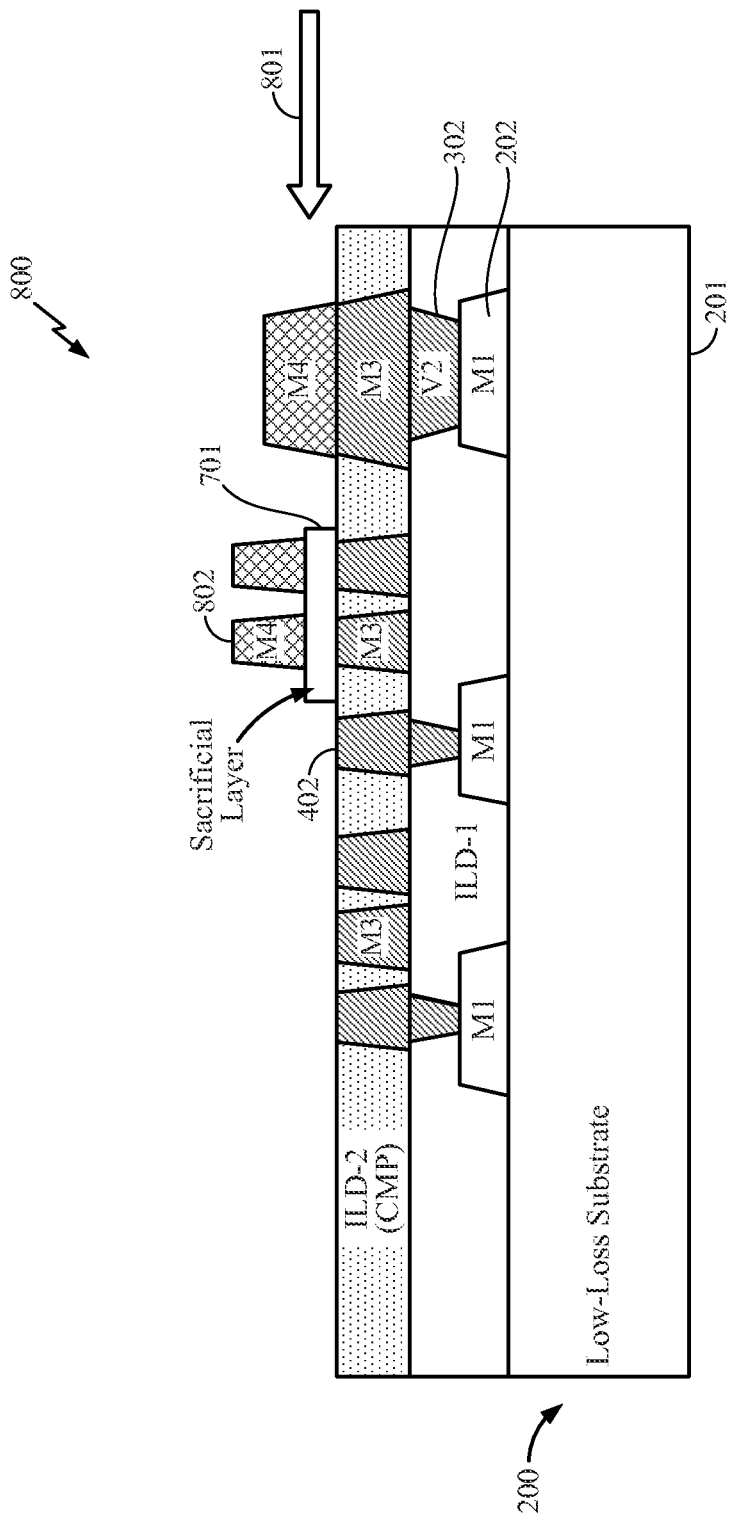
FIG. 8 is a diagram of a particular embodiment of a stage of forming a VHT with an air-gap structure including forming upper inductors.

As illustrated in a processing stage 800 in FIG. 8, a conductive layer 801 may be deposited over the substrate 201 to form inductors 802. Materials for the conductive layer 801 may include any conductive materials suitable for making an RF inductor. In a particular embodiment, the conductive layer 801 is made of metal such as copper (Cu) or a metal alloy. The conductive layer 801 may be formed through film deposition processes, such as electroplating, physical vapor deposition (PVD), or chemical vapor deposition (CVD). A photolithography-etch process flow may be performed on the conductor layer 801 to form the patterned inductors 802. The inductors 802 may be of any suitable height. In a particular embodiment, the height of the inductors 802 is about 10 um. The inductor 802 as illustrated in FIG. 8 may correspond to a cross-sectional view of the upper inductor 102 of FIG. 1.

Figure 9:
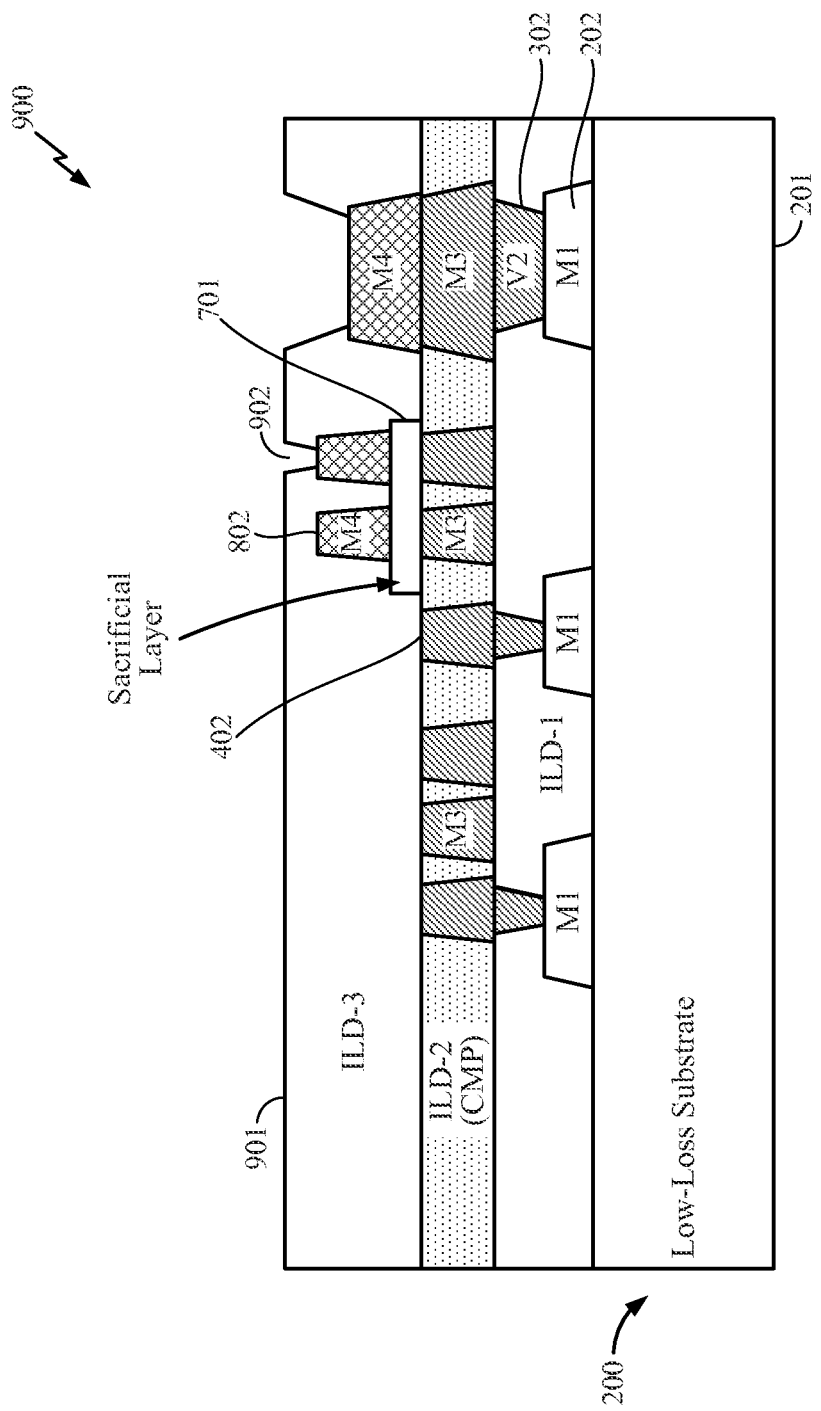
FIG. 9 is a diagram of a particular embodiment of a stage of forming a VHT with an air-gap structure including forming a dielectric layer and creating via holes.

As illustrated in a processing stage 900 in FIG. 9, a dielectric layer 901 may be subsequently deposited over the substrate 101 to insulate the inductors 802 from other circuitry or devices. Materials of the dielectric layer 901 may include silicon dioxide ($SiO_2$), silicon nitride ($Si_3N_4$), or insulating polymers. In a particular embodiment, the thickness of the dielectric layer 901 is about 15 um. An anisotropic etch process may be performed on the substrate 201 to create via holes 902 in the dielectric layer 901. The via holes 902 may be used in forming connectors in a later processing stage. In a particular embodiment, the depth of the via holes 902 is about 2 um.

Figure 10:
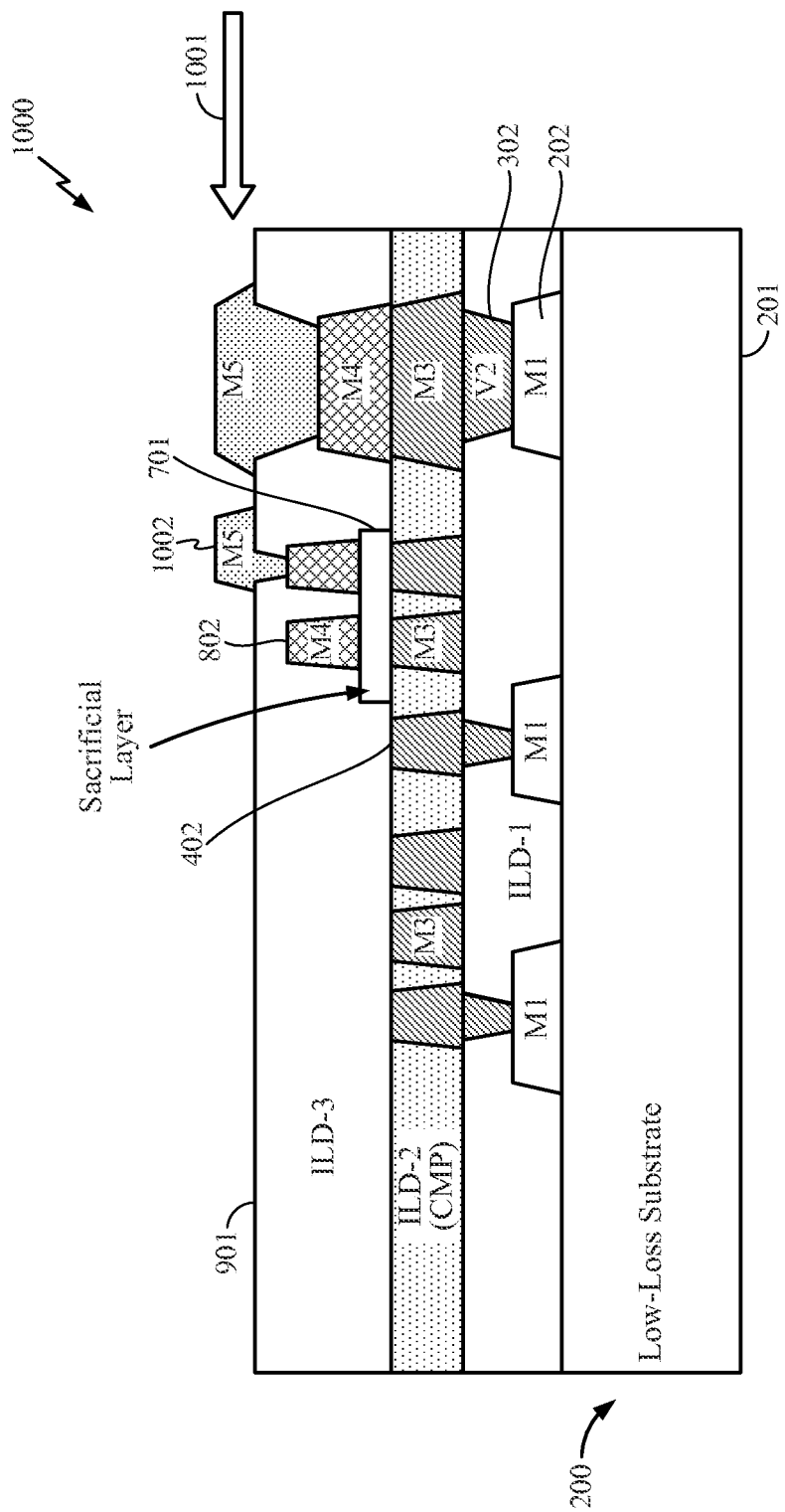
FIG. 10 is a diagram of a particular embodiment of a stage of forming a VHT with an air-gap structure including forming connectors.

As illustrated in a processing stage 1000 in FIG. 10, a conductive layer 1001 may be deposited over the substrate 201 to form connectors 1002 which may be used to connect the inductors 802 with other circuitry or devices. Materials for the conductive layer 1001 may include any conductive materials suitable for making a connector. In a particular embodiment, the conductive layer 1001 is made of metal or metal alloy, such as aluminum-copper (Al—Cu) alloy. The conductive layer 1001 may be formed through film deposition processes, such as physical vapor deposition (PVD) (e.g., sputtering) or chemical vapor deposition (CVD). In a particular embodiment, the conductive layer 203 is made of copper (Cu) and is formed using an electroplating process or a CVD process to obtain a highly conductive and low-loss layer. A photolithography-etch process flow may be performed on the conductor layer 1001 to form the patterned connectors 1002. In a particular embodiment, the thickness of the connectors 1002 is about 10 um.

Figure 11:
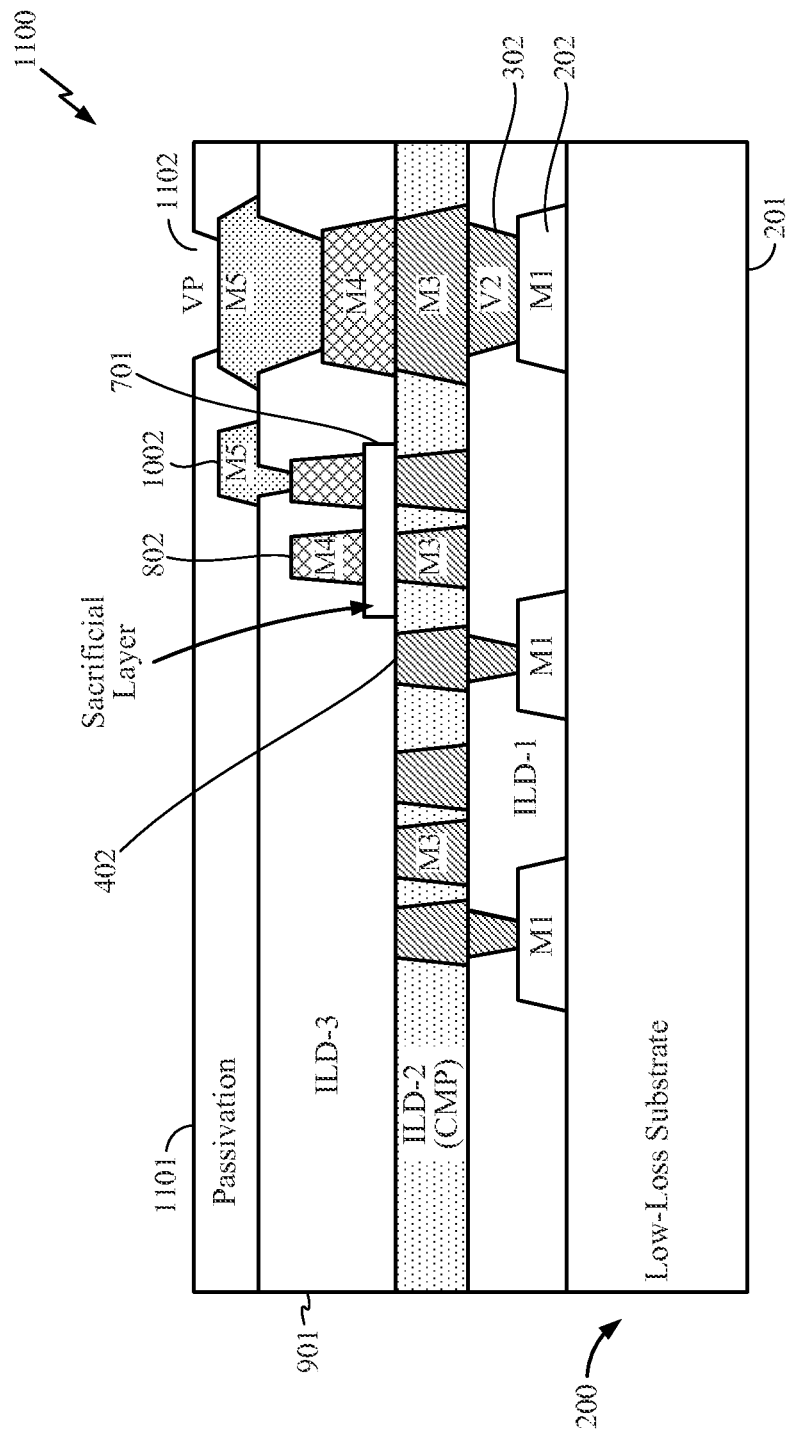
FIG. 11 is a diagram of a particular embodiment of a stage of forming a VHT with an air-gap structure including forming a passivation layer and forming an opening for probing or bonding.

As illustrated in a processing stage 1100 in FIG. 11, a passivation layer 1101 may be subsequently formed over the substrate 201 to electrically insulate the inductors 802 and the connectors 1002 from other circuitry or devices in any wafers bonded to the wafer 200. An anisotropic etch process may be performed on the substrate 201 to create an opening 1102 in the passivation layer 1101. The opening 1102 may be used in probing the connectors 1002, bonding with the connectors 1002, or both.

Figure 12:
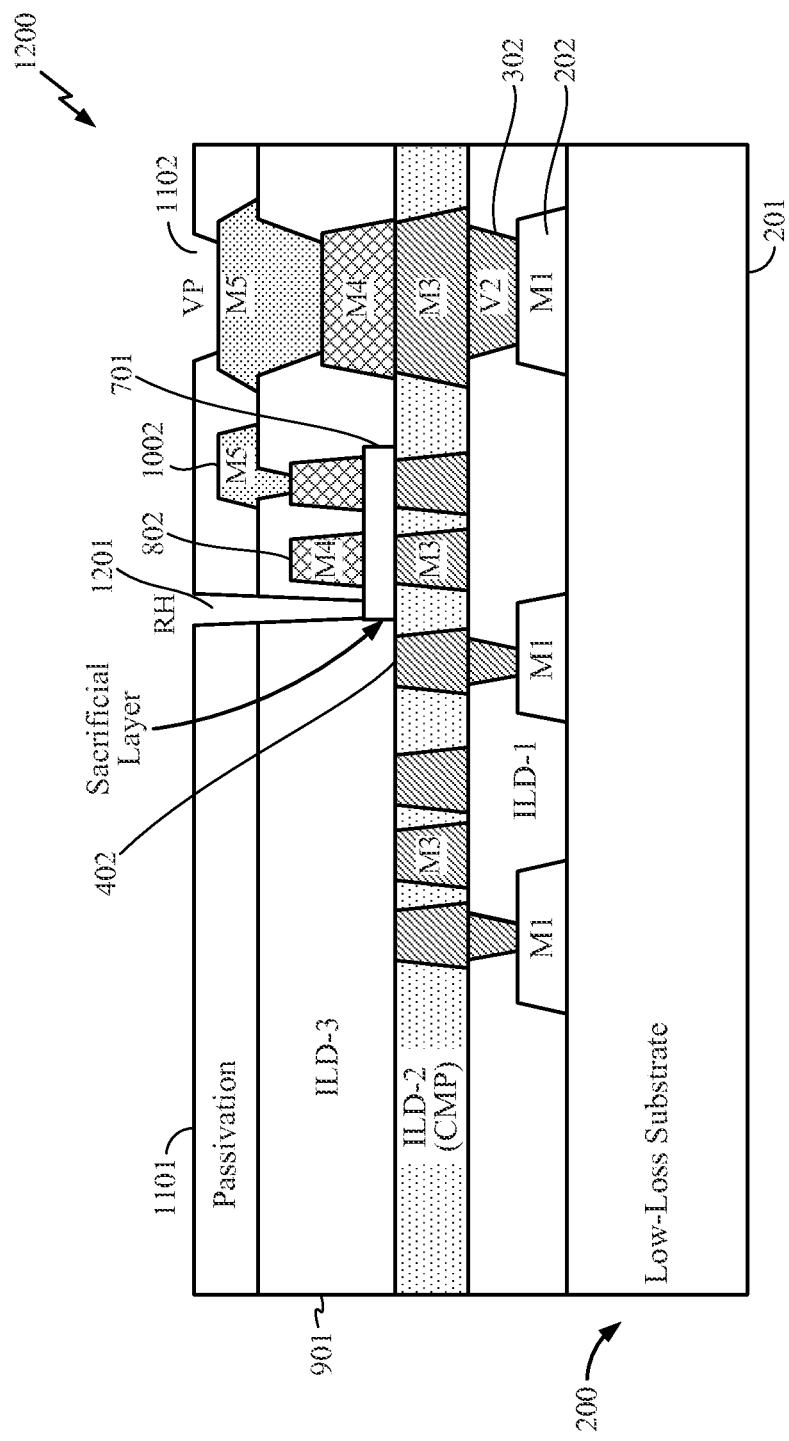
FIG. 12 is a diagram of a particular embodiment of a stage of forming a VHT with an air-gap structure including forming release holes.

As illustrated in a processing stage 1200 in FIG. 12, an anisotropic etch process may be performed on the substrate 201 to create one or more recesses 1201 in the dielectric layer 901 and the passivation layer 1101. The one or more recesses 1201 may be used as release holes to remove the sacrificial layer 701 and to form an air-gap as described with respect to FIG. 13.

Figure 13:
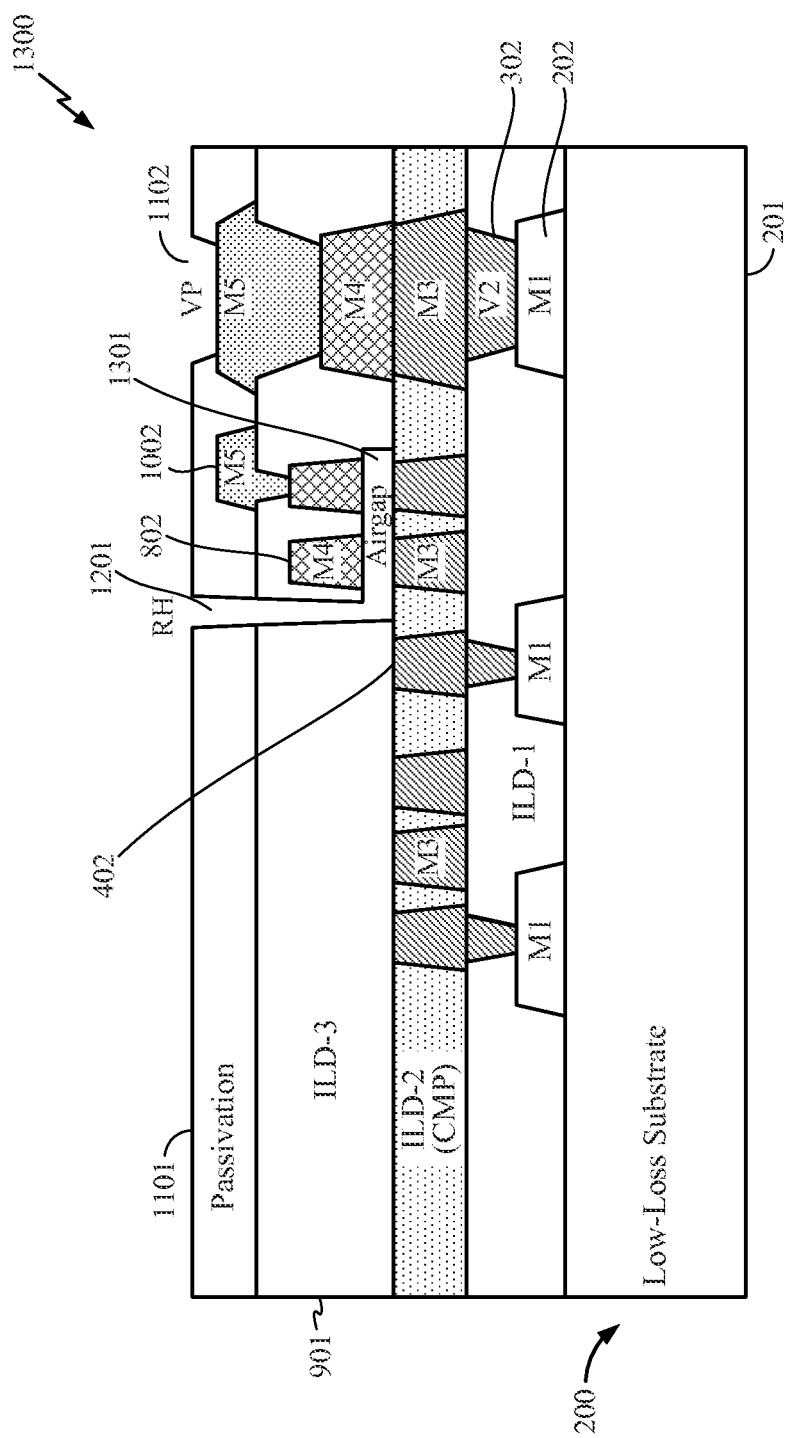
FIG. 13 is a diagram of a particular embodiment of a stage of forming a VHT with an air-gap structure including removing sacrificial materials from a sacrificial layer.

As illustrated in a processing stage 1300 in FIG. 13, after creating the one or more recesses 1201, a process may be applied to remove the sacrificial layer 701. The process could be any suitable process, such as a chemical process (e.g., wet etching or vapor phase etching). Once the sacrificial layer 701 is removed, an air-gap 1301 is formed between the inductors 402 and the inductors 802. The air-gap 1301 may include a micro-electromechanical-type (MEMS) air-gap. Having the air-gap 1301 in a POG VHT enhances the POG VHT's performance. For example, using the POG VHT with the air-gap 1301 between the inductors 402 and the inductors 802 in a RF duplexer configuration may improve TX-RX isolation and ANT-RX sensitivity, and may reduce TX-ANT and RX-ANT insertion loss, as compared with using a VHT that contains a dielectric layer between the inductors 402 and the inductors 802.

It is noted that the sacrificial layer 701 and the process of forming the air-gap 1301 shown above are described for ease of illustration and clarity. Those skilled in the art shall realize that, in practice, an air-gap in many configurations may be formed in the wafer 200. In a particular embodiment, multiple air-gaps may be formed between multiple inductors 402 and multiple inductors 802.

It is noted that other suitable processing techniques, such as a damascene process, may be used to form the inductors 402 and 802 and the connector layers 202 and 1002.

It is also noted that the inductors 402 and 802 and the process of forming the inductors 402 and 802 shown above are for the ease of illustration and clarity. Those skilled in the art shall realize that, in practice, many inductors of various parameters and configurations may be formed in the wafer 200 after the above illustrative processing procedures. In a particular embodiment, an array of planar inductors in the shape of square, hollow, circular, or octagonal is formed. In another embodiment, an array of spiral inductors in the shape of square, hollow, circular, or octagonal is formed.

It is also noted that the inductors 402 and 802 may be formed as multiple vertical-coupling inductors in a parallel configuration. The multiple vertical-coupling inductors may include multiple sets of two vertical-coupling inductors. As illustrated in a multiple vertical-coupling embodiment 1400 in FIG. 14, the multiple vertical-coupling inductors may also include two vertical-coupling inductor structures, each of which comprises a series of inductors 1401 and 1402 connected by connectors and in a parallel configuration. The inductors 1401 are disposed in parallel as a first stack, the inductors 1402 are disposed in parallel as a second stack, and the first stack is disposed in parallel with the second stack.

It is also noted that, in addition to the parallel configuration, the inductors 402 and 802 may also be formed in an interleave configuration. As illustrated in an interleave configuration 1500 in FIG. 15, the interleave configuration 1500 comprises a series of inductors of a first type 1501 and a series of inductors of a second type 1502. Each of the first type inductors 1501 and the second type inductors 1502 comprises a portion of an inductor in the preceding configurations.

Each first type inductor 1501 is paired with and laterally disposed with each second type inductor 1502 to form an inductor structure. One inductor structure is disposed a first distance from another inductor structure. Namely, the inductor structures are disposed in parallel. In addition, the first type inductor 1501 of one inductor structure is connected with the first type inductor 1501 of another inductor structure through connectors. Likewise, the second type inductor 1502 of one inductor structure is connected with the second type inductor 1502 of another inductor structure through connectors.

Figure 14:
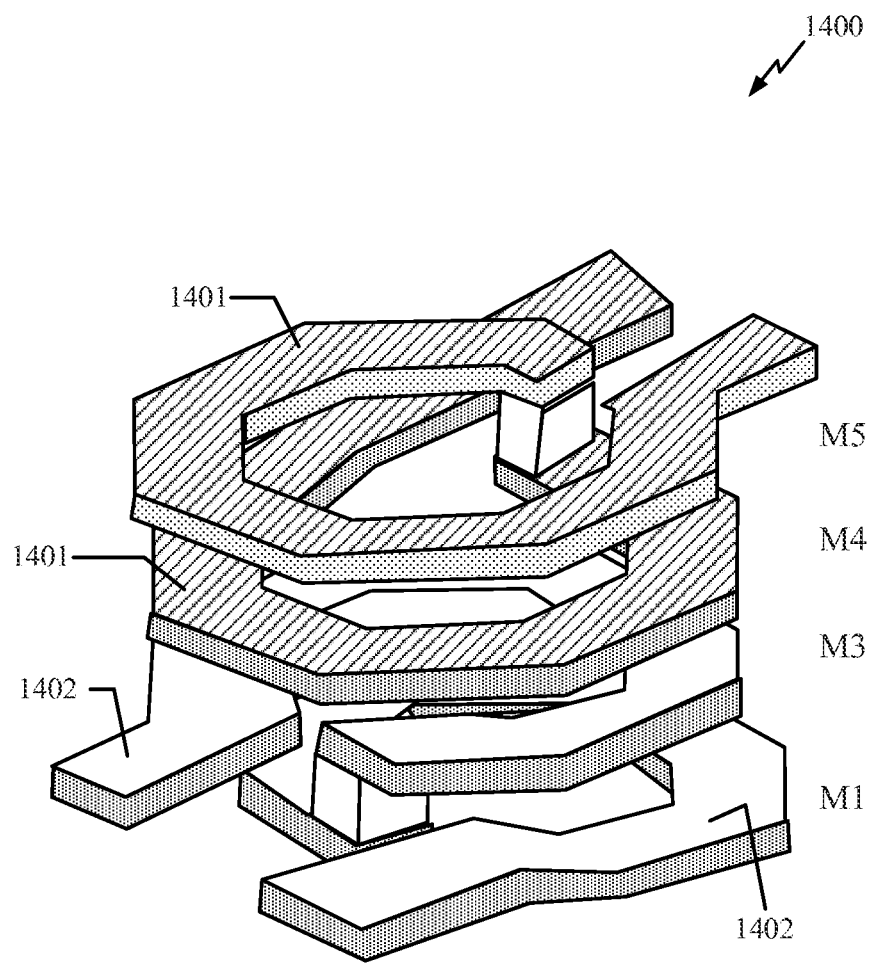
FIG. 14 is a diagram of a particular embodiment of a VHT with multiple inductors in a parallel configuration.

The interleave configuration 1500 may be used in applications that use the vertical-coupling transformer (VHT) 120 of FIG. 1 or the multiple vertical-coupling embodiment 1400 of FIG. 14. For example, the interleave configuration 1500 may be used in a wireless communications device, such as an RF duplexer. Air-gaps between the first type inductors and the second type inductors of the interleave configuration 1500 may improve TX-RX isolation and ANT-RX signaling coupling and may reduce ANT-RX insertion loss and TX-ANT insertion loss associated with the wireless communications device, as compared to using a vertical transformer without an air-gap in the wireless communications device.

Figure 16:
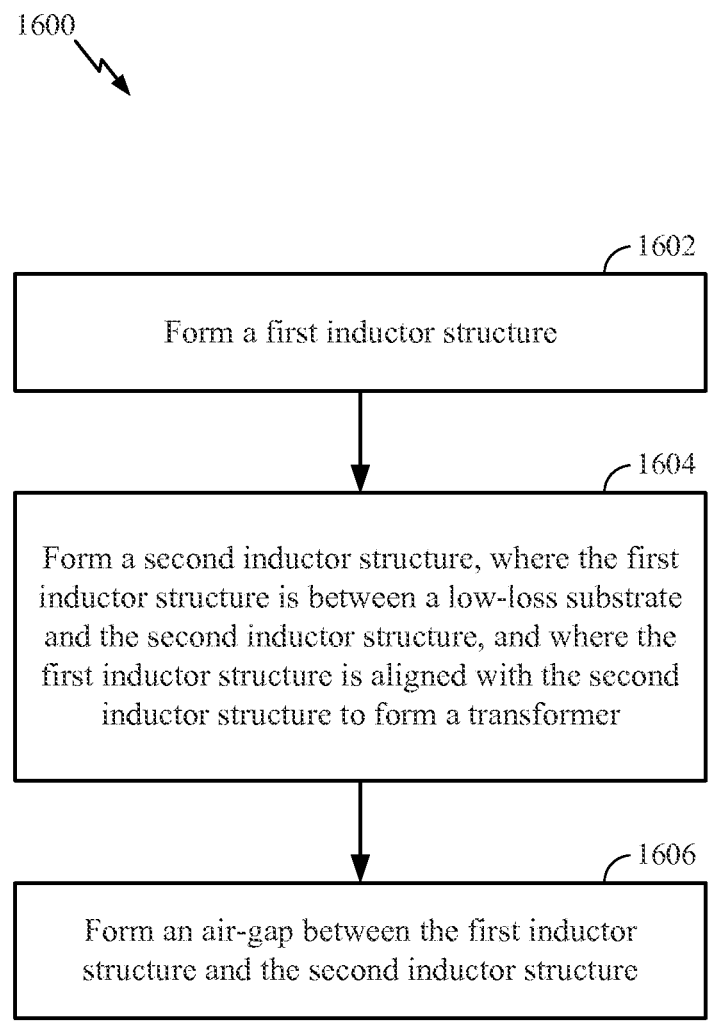
FIG. 16 is a flow chart of a particular illustrative embodiment of a method of forming a VHT with an air-gap structure.

Referring to FIG. 16, a flow chart of a particular illustrative embodiment of a method of forming a vertical-coupling transformer (VHT) with an air-gap structure (e.g., the POG VHT 120) is depicted and generally designated 1600. One or more operations of the method 1600 may be performed by a processor integrated into an electronic device, such as equipment of a semiconductor manufacturing plant (e.g., a "fab"), as further described with reference to FIG. 19.

The method 1600 includes forming a first inductor structure, at 1602. For example, the first inductor structure may correspond to the lower inductor 101 of FIG. 1. To illustrate, as described with reference to FIG. 4, the inductor 402 may be formed a first distance from the glass substrate 201. The inductor 402 may correspond to the lower inductor 101 of FIG. 1 and the glass substrate 201 may correspond to the glass substrate 132 of FIG. 1.

The method 1600 also includes forming a second inductor structure, at 1604. The first inductor structure may be between a low-loss substrate and the second inductor structure. The first inductor structure may be aligned with the second inductor structure to form a transformer. For example, the second inductor structure may correspond to the upper inductor 102 of FIG. 1. To illustrate, as described with reference to FIG. 8, the inductor 802 may be formed a second distance from the glass substrate 201 to form a VHT, where the second distance is greater than the first distance. The inductor 802 may correspond to the upper inductor 102 of FIG. 1.

The method 1600 further includes forming an air-gap between the first inductor structure and the second inductor structure, at 1606. For example, as described with reference to FIG. 13, the air-gap 1301 may be formed between the inductor 402 and the inductor 802. The air-gap 1301 may correspond to the air-gap 103 of FIG. 1.

It will be appreciated that forming the VHT with an air-gap structure may improve TX-RX isolation associated with a wireless communications device, as compared to using a vertical transformer without an air-gap. In at least one embodiment, forming the VHT with an air-gap structure may reduce parasitic capacitance coupling between input inductors (e.g. the inductor 402) and output inductors (e.g., the inductor 802), thereby improving the TX-RX isolation associated with the wireless communications device.

Referring to FIG. 17, a flow chart of a particular illustrative embodiment of a method of forming a vertical-coupling transformer (VHT) with an air-gap structure (e.g., the POG VHT 120) is depicted and generally designated 1700. One or more operations of the method 1700 may be performed by a processor integrated into an electronic device, such as equipment of a semiconductor manufacturing plant (e.g., a "fab"), as further described with reference to FIG. 19.

The method 1700 includes forming inductor structures, at 1702. Each of the inductor structures may include a first inductor and a second inductor. The first inductor and the second inductor may be proximate to each other. The inductor structures may be disposed in parallel. The first inductor in a first inductor structure may be connected with the first inductor in a second inductor structure. The second inductor in the first inductor structure may be connected with the second inductor in the second inductor structure. The first inductor structure may be between a low-loss substrate and the second inductor structure. The first inductor structure may be aligned with the second inductor structure to form a transformer. For example, as described with reference to FIG. 14, each of two vertical-coupling inductor structures includes the inductors 1401 and 1402 connected by connectors and in a parallel configuration.

The method 1700 also includes forming an air-gap between the first inductor structure and the second inductor structure, at 1704. For example, as described with reference to FIG. 13, an air-gap may be formed between the inductor 402 and the inductor 802. In a particular embodiment, the inductor 402 may correspond to the inductors 1401 of the two inductor structures of FIG. 14. The inductor 802 may correspond to the inductors 1402 of the two inductor structures of FIG. 14.

One or more of the operations described with reference to the method 1600 of FIG. 16, the method 1700 of FIG. 17, or a combination thereof, may be performed by a field-programmable gate array (FPGA) device, an application-specific integrated circuit (ASIC), a processing unit such as a central processing unit (CPU), a digital signal processor (DSP), a controller, another hardware device, a firmware device, or any combination thereof. As an example, the method 1600 of FIG. 16, the method 1700 of FIG. 17, or a combination thereof, may be performed by semiconductor fabrication equipment, such as a processor that executes instructions stored at a memory (e.g., a non-transitory computer-readable medium), as described further with reference to FIG. 19.

Figure 18:
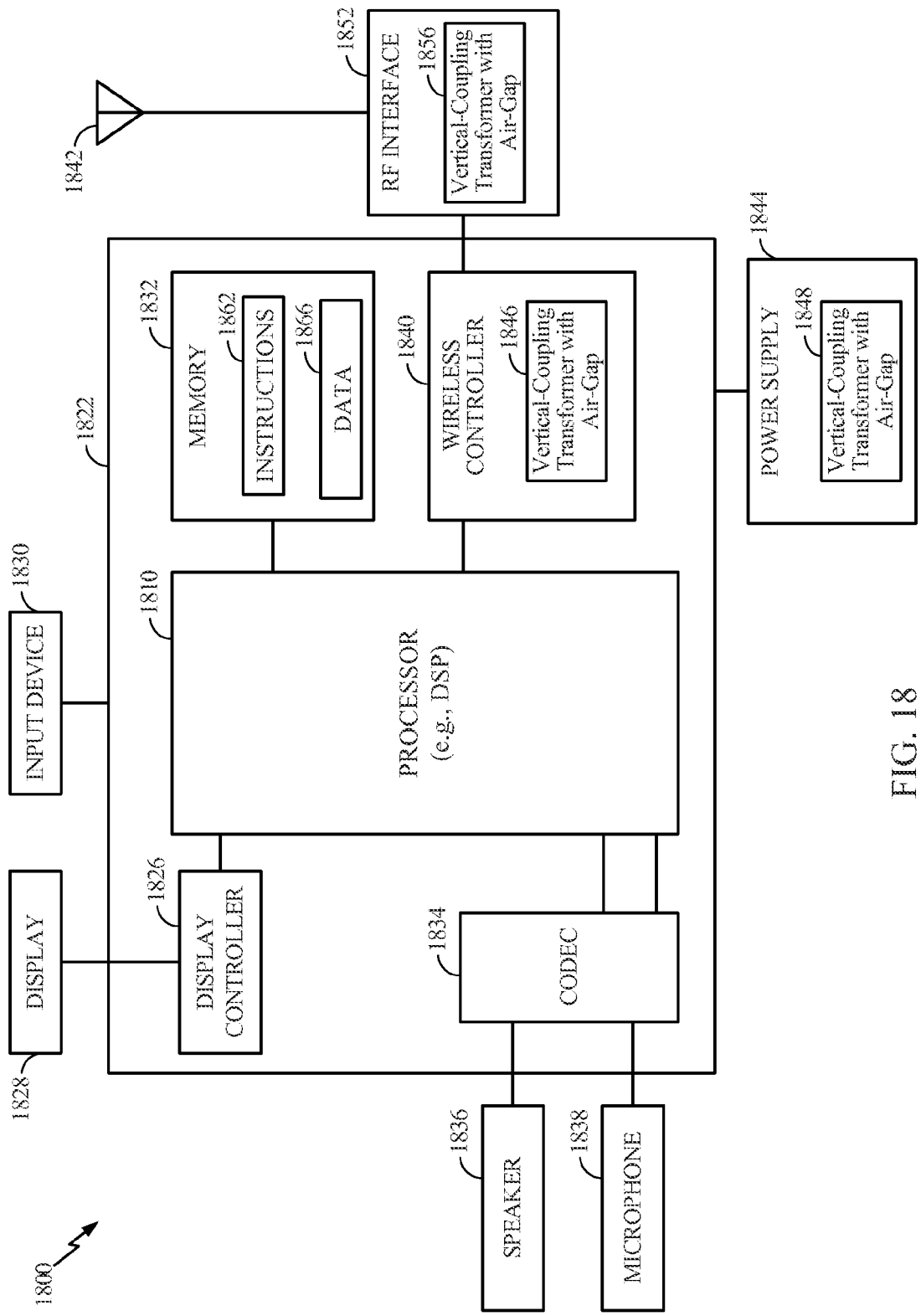
FIG. 18 is a block diagram of a communication device including a VHT with an air-gap structure.

Referring to FIG. 18, a block diagram of a particular illustrative embodiment of a mobile device is depicted and generally designated 1800. The mobile device 1800 may include a processor 1810, such as a digital signal processor (DSP). The processor 1810 may be coupled to a memory 1832 (e.g., a random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art). The memory 1832 may store instructions 1862 executable by the processor 1810. The memory 1832 may store data 1866 accessible to the processor 1810.

Figure 15:
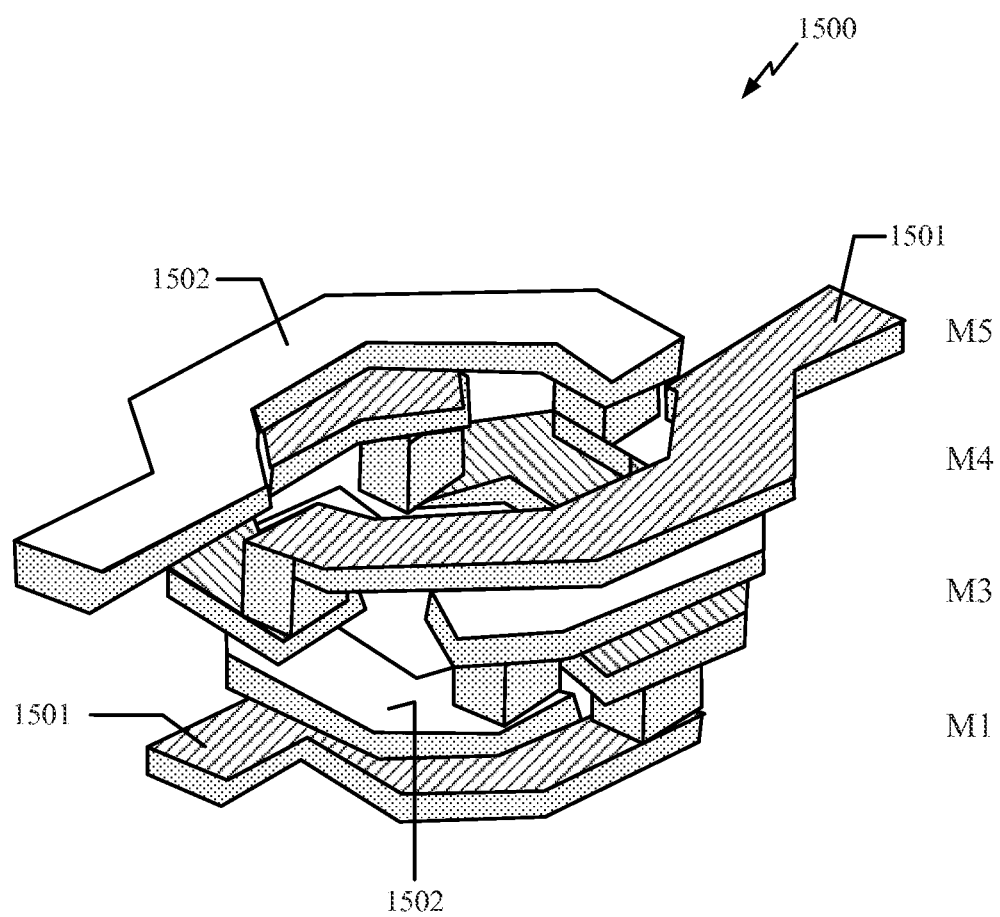
FIG. 15 is a diagram of a particular embodiment of a VHT with multiple inductors in an interleave configuration with an air-gap structure.

The mobile device 1800 includes at least one VHT formed with an air-gap, such as the POG VHT 120 of FIG. 1, the multiple vertical-coupling embodiment 1400 of FIG. 14, the interleave configuration 1500 of FIG. 15, a VHT formed according to the method 1600 of FIG. 16, and/or a VHT formed according to the method 1700 of FIG. 17. For example, as depicted in FIG. 18, the RF interface 1852 may include a VHT 1856 (e.g., the POG VHT 120 of FIG. 1, the multiple vertical-coupling embodiment 1400 of FIG. 14, the interleave configuration 1500 of FIG. 15, a VHT formed according to the method 1600 of FIG. 16, and/or a VHT formed according to the method 1700 of FIG. 17). As another example, FIG. 18 illustrates that the power supply 1844 may include a VHT 1848 (e.g., the POG VHT 120 of FIG. 1, the multiple vertical-coupling embodiment 1400 of FIG. 14, the interleave configuration 1500 of FIG. 15, a VHT formed according to the method 1600 of FIG. 16, and/or a VHT formed according to the method 1700 of FIG. 17). As another example, the system-on-chip device 1822, one or more components of the system-on-chip device 1822, or a combination thereof, may include the POG VHT 120 of FIG. 1, the multiple vertical-coupling embodiment 1400 of FIG. 14, the interleave configuration 1500 of FIG. 15, a VHT formed according to the method 1600 of FIG. 16, and/or a VHT formed according to the method 1700 of FIG. 17. For example, as depicted in FIG. 18, the wireless controller 1840 may include the VHT 1846 (e.g. the POG VHT 120 of FIG. 1, the multiple vertical-coupling embodiment 1400 of FIG. 14, the interleave configuration 1500 of FIG. 15, a VHT formed according to the method 1600 of FIG. 16, and/or a VHT formed according to the method 1700 of FIG. 17). In a particular embodiment, the VHT 1846 may be used as or within a RF duplexer.

FIG. 18 also shows a display controller 1826 that is coupled to the processor 1810 and to a display 1828. A coder/decoder (CODEC) 1834 may also be coupled to the processor 1810. A speaker 1836 and a microphone 1838 may be coupled to the CODEC 1834. FIG. 18 also indicates that a wireless controller 1840 may be coupled to the processor 1810 and may be further coupled to a wireless antenna 1842 via a radio frequency (RF) interface 1852.

In a particular embodiment, the processor 1810, the display controller 1826, the memory 1832, the CODEC 1834, and the wireless controller 1840 are included in a system-in-package or system-on-chip device 1822. An input device 1830 and a power supply 1844 may be coupled to the system-on-chip device 1822. Moreover, in a particular embodiment, and as illustrated in FIG. 18, the display 1828, the input device 1830, the speaker 1836, the microphone 1838, the wireless antenna 1842, and the power supply 1844 are external to the system-on-chip device 1822. However, each of the display 1828, the input device 1830, the speaker 1836, the microphone 1838, the wireless antenna 1842, and the power supply 1844 may be coupled to a component of the system-on-chip device 1822, such as an interface or a controller.

The foregoing disclosed devices and functionalities may be designed and configured into computer files (e.g. RTL, GDSII, GERBER, etc.) stored on computer-readable media. Some or all such files may be provided to fabrication handlers to fabricate devices based on such files. Resulting products include semiconductor wafers that are then cut into semiconductor dies and packaged into semiconductor chips. The semiconductor chips are then integrated into electronic devices, as described further with reference to FIG. 19.

Figure 19:
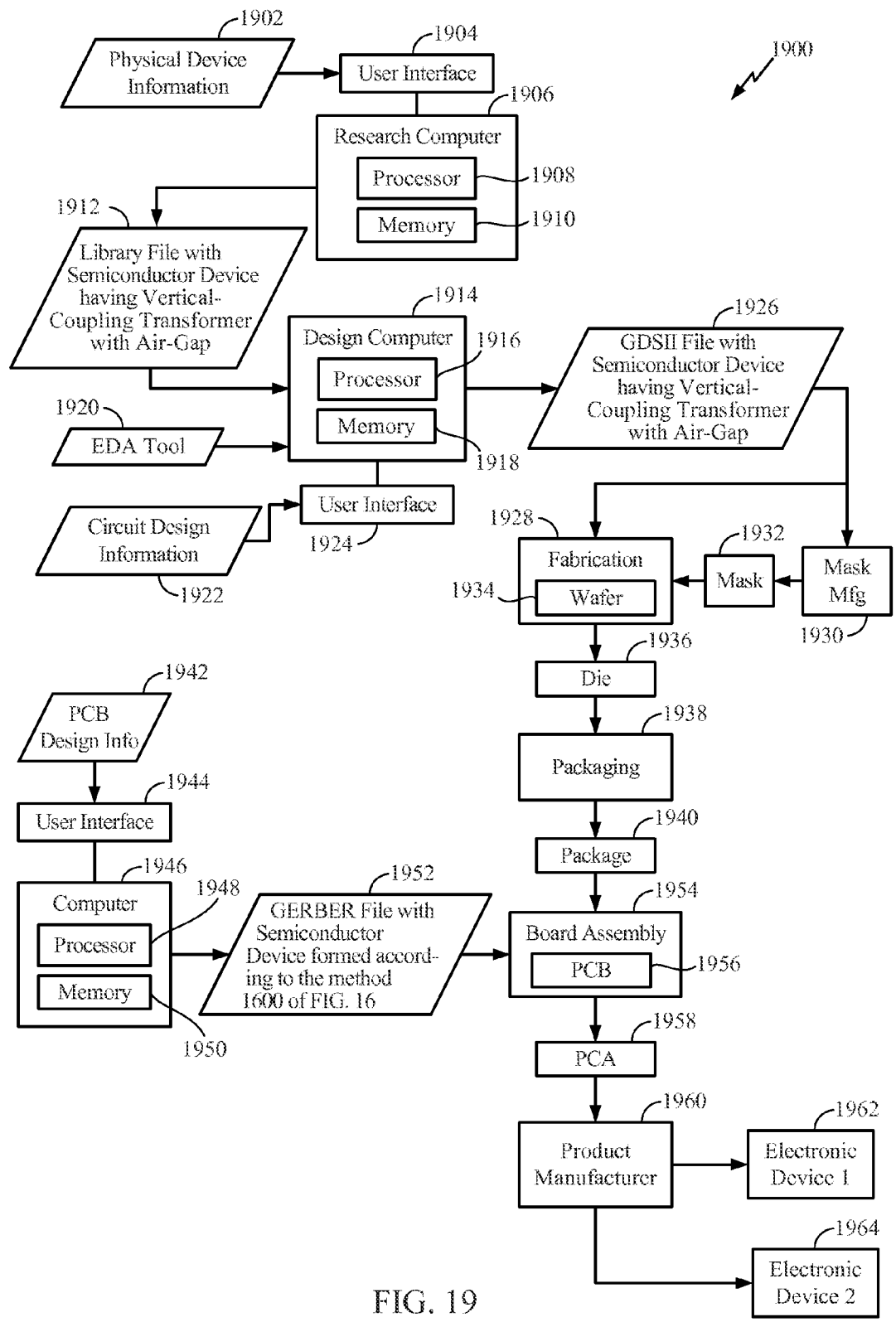
FIG. 19 is a data flow diagram of a particular illustrative embodiment of a manufacturing process to manufacture electronic devices that include a semiconductor device with an air-gap structure.

Referring to FIG. 19, a particular illustrative embodiment of an electronic device manufacturing process is depicted and generally designated 1900. In FIG. 19, physical device information 1902 is received at the manufacturing process 1900, such as at a research computer 1906. The physical device information 1902 may include design information representing at least one physical property of a semiconductor device, such as a VHT formed with an air-gap (e.g., the POG VHT 120 of FIG. 1, the multiple vertical-coupling embodiment 1400 of FIG. 14, the interleave configuration 1500 of FIG. 15, a VHT formed according to the method 1600 of FIG. 16, and/or a VHT formed according to the method 1700 of FIG. 17). For example, the physical device information 1902 may include physical parameters, material characteristics, and structure information that is entered via a user interface 1904 coupled to the research computer 1906. The research computer 1906 includes a processor 1908, such as one or more processing cores, coupled to a computer-readable medium such as a memory 1910. The memory 1910 may store computer-readable instructions that are executable to cause the processor 1908 to transform the physical device information 1902 to comply with a file format and to generate a library file 1912.

In a particular embodiment, the library file 1912 includes at least one data file including the transformed design information. For example, the library file 1912 may include a library of semiconductor devices, including a semiconductor device (e.g., the POG VHT 120 of FIG. 1, the multiple vertical-coupling embodiment 1400 of FIG. 14, the interleave configuration 1500 of FIG. 15, a VHT formed according to the method 1600 of FIG. 16, and/or a VHT formed according to the method 1700 of FIG. 17), provided for use with an electronic design automation (EDA) tool 1920.

The library file 1912 may be used in conjunction with the EDA tool 1920 at a design computer 1914 including a processor 1916, such as one or more processing cores, coupled to a memory 1918. The EDA tool 1920 may be stored as processor executable instructions at the memory 1918 to enable a user of the design computer 1914 to design a circuit including the semiconductor device (e.g., the POG VHT 120 of FIG. 1, the multiple vertical-coupling embodiment 1400 of FIG. 14, the interleave configuration 1500 of FIG. 15, a VHT formed according to the method 1600 of FIG. 16, and/or a VHT formed according to the method 1700 of FIG. 17), using the library file 1912. For example, a user of the design computer 1914 may enter circuit design information 1922 via a user interface 1924 coupled to the design computer 1914. The circuit design information 1922 may include design information representing at least one physical property of a semiconductor device, such as a semiconductor device (e.g., the POG VHT 120 of FIG. 1, the multiple vertical-coupling embodiment 1400 of FIG. 14, the interleave configuration 1500 of FIG. 15, a VHT formed according to the method 1600 of FIG. 16, and/or a VHT formed according to the method 1700 of FIG. 17). To illustrate, the circuit design property may include identification of particular circuits and relationships to other elements in a circuit design, positioning information, feature size information, interconnection information, or other information representing a physical property of a semiconductor device.

The design computer 1914 may be configured to transform the design information, including the circuit design information 1922, to comply with a file format. To illustrate, the file formation may include a database binary file format representing planar geometric shapes, text labels, and other information about a circuit layout in a hierarchical format, such as a Graphic Data System (GDSII) file format. The design computer 1914 may be configured to generate a data file including the transformed design information, such as a GDSII file 1926 that includes information describing a semiconductor device (e.g., the POG VHT 120 of FIG. 1, the multiple vertical-coupling embodiment 1400 of FIG. 14, the interleave configuration 1500 of FIG. 15, a VHT formed according to the method 1600 of FIG. 16, and/or a VHT formed according to the method 1700 of FIG. 17), in addition to other circuits or information. To illustrate, the data file may include information corresponding to a system-on-chip (SOC) that includes a semiconductor device (e.g., the POG VHT 120 of FIG. 1, the multiple vertical-coupling embodiment 1400 of FIG. 14, the interleave configuration 1500 of FIG. 15, a VHT formed according to the method 1600 of FIG. 16, and/or a VHT formed according to the method 1700 of FIG. 17), and that also includes additional electronic circuits and components within the SOC.

The GDSII file 1926 may be received at a fabrication process 1928 to manufacture a semiconductor device (e.g., the POG VHT 120 of FIG. 1, the multiple vertical-coupling embodiment 1400 of FIG. 14, the interleave configuration 1500 of FIG. 15, a VHT formed according to the method 1600 of FIG. 16, and/or a VHT formed according to the method 1700 of FIG. 17), and according to transformed information in the GDSII file 1926. For example, a device manufacture process may include providing the GDSII file 1926 to a mask manufacturer 1930 to create one or more masks, such as masks to be used with photolithography processing, illustrated in FIG. 19 as a representative mask 1932. The mask 1932 may be used during the fabrication process to generate one or more wafers, illustrated in FIG. 19 as a representative wafer 1934. In at least one embodiment, the wafer 1934 includes the wafer 200. Accordingly to further embodiments, the wafer 200 may be generated using alternate techniques. The wafer 1934 may be tested and separated into dies, such as a representative die 1936. The die 1936 includes a circuit including a semiconductor device (e.g., the POG VHT 120 of FIG. 1, the multiple vertical-coupling embodiment 1400 of FIG. 14, the interleave configuration 1500 of FIG. 15, a VHT formed according to the method 1600 of FIG. 16, and/or a VHT formed according to the method 1700 of FIG. 17).

In conjunction with the described embodiments, a non-transitory computer-readable medium stores instructions executable by a computer to perform the method 1600 of FIG. 16, the method 1700 of FIG. 17, or a combination thereof. For example, equipment of a semiconductor manufacturing plant may include the computer and the memory and may perform the method 1600 of FIG. 16, the method 1700 of FIG. 17, or a combination thereof, such as in connection with the fabrication process 1928 and using the GDSII file 1926. To illustrate, the computer may execute instructions to initiate forming first inductor structure, forming a second inductor structure, and forming an air-gap between the first inductor structure and the second inductor structure, as described with reference to FIG. 16.

The die 1936 may be provided to a packaging process 1938 where the die 1936 is incorporated into a representative package 1940. For example, the package 1940 may include the single die 1936 or multiple dies, such as a system-in-package (SiP) arrangement. The package 1940 may be configured to conform to one or more standards or specifications, such as Joint Electron Device Engineering Council (JEDEC) standards.

Information regarding the package 1940 may be distributed to various product designers, such as via a component library stored at a computer 1946. The computer 1946 may include a processor 1948, such as one or more processing cores, coupled to a memory 1950. A printed circuit board (PCB) tool may be stored as processor executable instructions at the memory 1950 to process PCB design information 1942 received from a user of the computer 1946 via a user interface 1944. The PCB design information 1942 may include physical positioning information of a packaged semiconductor device on a circuit board, the packaged semiconductor device corresponding to the package 1940 including a semiconductor device (e.g., the POG VHT 120 of FIG. 1, the multiple vertical-coupling embodiment 1400 of FIG. 14, the interleave configuration 1500 of FIG. 15, a VHT formed according to the method 1600 of FIG. 16, and/or a VHT formed according to the method 1700 of FIG. 17).

The computer 1946 may be configured to transform the PCB design information 1942 to generate a data file, such as a GERBER file 1952 with data that includes physical positioning information of a packaged semiconductor device on a circuit board, as well as layout of electrical connections such as traces and vias, where the packaged semiconductor device corresponds to the package 1940 including a semiconductor device (e.g., the POG VHT 120 of FIG. 1, the multiple vertical-coupling embodiment 1400 of FIG. 14, the interleave configuration 1500 of FIG. 15, a VHT formed according to the method 1600 of FIG. 16, and/or a VHT formed according to the method 1700 of FIG. 17). In other embodiments, the data file generated by the transformed PCB design information may have a format other than a GERBER format.

The GERBER file 1952 may be received at a board assembly process 1954 and used to create PCBs, such as a representative PCB 1956, manufactured in accordance with the design information stored within the GERBER file 1952. For example, the GERBER file 1952 may be uploaded to one or more machines to perform various steps of a PCB production process. The PCB 1956 may be populated with electronic components including the package 1940 to form a representative printed circuit assembly (PCA) 1958.

The PCA 1958 may be received at a product manufacture process 1960 and integrated into one or more electronic devices, such as a first representative electronic device 1962 and a second representative electronic device 1964. As an illustrative, non-limiting example, the first representative electronic device 1962, the second representative electronic device 1964, or both, may be a cellular phone, a wireless local area network (LAN) device, a set top box, a music player, a video player, an entertainment unit, a navigation device, a communications device, a personal digital assistant (PDA), a fixed location data unit, and a computer, into which a semiconductor device (e.g., the POG VHT 120 of FIG. 1, the multiple vertical-coupling embodiment 1400 of FIG. 14, the interleave configuration 1500 of FIG. 15, a VHT formed according to the method 1600 of FIG. 16, and/or a VHT formed according to the method 1700 of FIG. 17) is integrated. As another illustrative, non-limiting example, one or more of the electronic devices 1962 and 1964 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 19 illustrates remote units according to teachings of the disclosure, the disclosure is not limited to these illustrated units. Embodiments of the disclosure may be suitably employed in any device which includes active integrated circuitry including memory and on-chip circuitry.

A device that includes a semiconductor device (e.g., the POG VHT 120 of FIG. 1, the multiple vertical-coupling embodiment 1400 of FIG. 14, the interleave configuration 1500 of FIG. 15, a VHT formed according to the method 1600 of FIG. 16, and/or a VHT formed according to the method 1700 of FIG. 17) may be fabricated, processed, and incorporated into an electronic device, as described in the illustrative process 1900. One or more aspects of the embodiments disclosed with respect to FIGS. 1-19 may be included at various processing stages, such as within the library file 1912, the GDSII file 1926, and the GERBER file 1952, as well as stored at the memory 1910 of the research computer 1906, the memory 1918 of the design computer 1914, the memory 1950 of the computer 1946, the memory of one or more other computers or processors (not shown) used at the various stages, such as at the board assembly process 1954, and also incorporated into one or more other physical embodiments such as the wafer 1934, the die 1936, the package 1940, the PCA 1958, other products such as prototype circuits or devices (not shown), or any combination thereof. Although various representative stages are depicted with reference to FIGS. 1-19, in other embodiments fewer stages may be used or additional stages may be included. Similarly, the process 1900 of FIG. 19 may be performed by a single entity or by one or more entities performing various stages of the process 1900.

In conjunction with the described embodiments, an apparatus is disclosed that includes a first semiconductor device (e.g., the POG VHT 120 of FIG. 1, the multiple vertical-coupling embodiment 1400 of FIG. 14, the interleave configuration 1500 of FIG. 15, a VHT formed according to the method 1600 of FIG. 16, and/or a VHT formed according to the method 1700 of FIG. 17). The first semiconductor device may include the VHT 1856, the VHT 1848, or a combination thereof. The apparatus further includes means for electrically coupling the first semiconductor device to at least a second semiconductor device (e.g., the PCB 1956).

In conjunction with the described embodiments, an apparatus is disclosed that includes means for generating a magnetic field. For example, the means for generating the magnetic field may include the lower inductor 101 of FIG. 1, the inductor 402 of FIG. 4, the inductors 1402 of FIG. 1, or a combination thereof.

The apparatus also includes means for generating a current in response to the magnetic field. The means for generating the magnetic field is between a low-loss substrate and the means for generating the current. The means for generating the magnetic field is aligned with the means for generating the current to form a transformer. An air-gap is between the means for generating the magnetic field and the means for generating the current. For example, the means for generating the current may include the upper inductor 102 of FIG. 1, the inductor 802 of FIG. 8, the inductors 1401 of FIG. 14, or a combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor may read information from, and write information to the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An integrated circuit device comprising:
a low-loss substrate;
a first inductor structure including a first inductor; and
a second inductor structure including a second inductor, wherein the first inductor is positioned between the low-loss substrate and the second inductor, wherein the first inductor is aligned with the second inductor to form a transformer, wherein the first inductor and the second inductor are separated by an air-gap, wherein the air-gap is defined by at least a first inductor surface of the first inductor and a first dielectric surface of a first dielectric layer, wherein the first dielectric surface is coplanar with the first inductor surface, and wherein a second inductor surface of the first inductor is coplanar with a second dielectric surface of the first dielectric layer.

2. The integrated circuit device of claim 1, further comprising:
a metal layer positioned between the low-loss substrate and the first inductor; and
a conductive layer positioned between the metal layer and the first inductor structure.

3. The integrated circuit device of claim 1, wherein the transformer includes a vertical-coupling transformer.

4. The integrated circuit device of claim 1, further comprising a dielectric material disposed on the first dielectric layer, wherein the dielectric material defines a sidewall of the air-gap, and wherein the low-loss substrate comprises a dielectric substrate or a semiconductor substrate.

5. The integrated circuit device of claim 1, wherein the low-loss substrate includes glass, quartz, sapphire, silicon-on-insulator substrate (SOI), Gallium Arsenide (GaAs), Indium phosphate (InP), silicon carbide (SiC), plastics, Rogers Laminates, silicon nitride, silicon oxynitride, ceramics, polymers, epoxies, or a combination thereof.

6. The integrated circuit device of claim 1, wherein the first inductor and the second inductor comprise a square planar or spiral inductor, a hollow planar or spiral inductor, a circular planar or spiral inductor, or an octagonal planar or spiral inductor.

7. The integrated circuit device of claim 1, wherein the first dielectric layer is disposed over an entire length of a side surface of the first inductor, and wherein a height of the first inductor is substantially the same as a height of the first dielectric layer.

8. The integrated circuit device of claim 1, wherein the first inductor structure comprises one or more first inductors and wherein the second inductor structure comprises one or more second inductors.

9. The integrated circuit device of claim 1, further comprising at least one semiconductor die into which the first inductor structure and the second inductor structure are integrated.

10. The integrated circuit device of claim 1, further comprising a device selected from a cellular phone, a wireless local area network (LAN) device, a set top box, a music player, a video player, an entertainment unit, a navigation device, a communications device, a personal digital assistant (PDA), a fixed location data unit, and a computer, into which the low-loss substrate, the first inductor structure, and the second inductor structure are integrated.

11. The device of claim 1, wherein the air-gap is formed by removing a sacrificial material located between the first inductor and the second inductor.

12. The device of claim 1, wherein the second inductor comprises two adjacent inductors, and wherein the air-gap is located below both of the adjacent inductors.

13. The integrated circuit device of claim 1, wherein the first inductor structure comprises multiple first inductors and the second inductor structure comprises multiple second inductors, and wherein the multiple first inductors and the multiple second inductors are coupled in parallel.

14. The integrated circuit device of claim 13, wherein the multiple first inductors are disposed in parallel as a first stack, wherein the multiple second inductors are disposed in parallel as a second stack, and wherein the first stack is disposed in parallel with the second stack.

15. The integrated circuit device of claim 13, wherein air-gaps are located between the multiple first inductors and the multiple second inductors.

16. The device of claim 1, wherein the first inductor comprises two adjacent inductors, and wherein the air-gap is located above both of the adjacent inductors.

17. The device of claim 16, wherein the second inductor comprises two adjacent inductors, and wherein the air-gap is located below both of the adjacent inductors.

18. The device of claim 1, wherein the second inductor is adjacent to a recess formed in a dielectric material, and wherein the recess extends through a surface defining a portion of the air-gap.

19. The device of claim 18, further comprising an inter-metal dielectric layer that includes the dielectric material, wherein the air-gap comprises a micro-electromechanical-type (MEMS) air-gap, and wherein the recess extends through a surface defining a portion of the air-gap at a region within the inter-metal dielectric layer.

20. The device of claim 18, wherein the dielectric material contacts the second inductor, and wherein the transformer includes a vertical-coupling transformer.

21. The device of claim 18, wherein the low-loss substrate comprises a dielectric substrate or a semiconductor substrate.

22. The device of claim 18, wherein a part of the air-gap is disposed via a chemical process at a region beside the second inductor following disposition of a portion of the recess via an etch at the region.

23. An integrated circuit device comprising:
a low-loss substrate; and
inductor structures, wherein each of the inductor structures comprises a first inductor and a second inductor, wherein the first inductor and the second inductor are proximate to each other and separated by an air-gap, wherein the first inductor is positioned between the second inductor and the low-loss substrate, wherein the first inductor is aligned with the second inductor to form a transformer, wherein the air-gap is defined by at least a first inductor surface of the first inductor and a first dielectric surface of a first dielectric layer, wherein the first dielectric surface is coplanar with the first inductor surface, and wherein a second inductor surface of the first inductor is coplanar with a second dielectric surface of the first dielectric layer.

24. The integrated circuit device of claim 23, wherein the inductor structures are in an interleave configuration.

25. The integrated circuit device of claim 23, wherein the first inductor comprises a square planar or spiral inductor, a hollow planar or spiral inductor, a circular planar or spiral inductor, or an octagonal planar or spiral inductor.

26. The integrated circuit device of claim 23, wherein the first dielectric layer is disposed over an entire length of a side surface of the first inductor, and wherein a height of the first inductor is substantially the same as a height of the first dielectric layer.

27. The integrated circuit device of claim 23, wherein the first and second inductors are disposed in parallel to each other.

28. The integrated circuit device of claim 23, further comprising:
at least one semiconductor die into which the inductor structures are integrated; and
a metal layer positioned between the low-loss substrate and the first inductor.

29. The integrated circuit device of claim 23, further comprising a device selected from a cellular phone, a wireless local area network (LAN) device, a set top box, a music player, a video player, an entertainment unit, a navigation device, a personal digital assistant (PDA), a fixed location data unit, and a computer, into which the low-loss substrate and the inductor structures are integrated.

30. An apparatus having a multi-layered structure comprising:
means for generating a magnetic field; and
means for generating a current in response to the magnetic field, wherein the means for generating the magnetic field is positioned between a low-loss substrate and the means for generating the current, wherein the means for generating the magnetic field comprises a first inductor and the means for generating the current comprises a second inductor, wherein the first inductor and the second inductor are separated by an air-gap, wherein the means for generating the magnetic field is aligned with the means for generating the current to form a transformer, wherein the air-gap is defined by at least a first inductor surface of the first inductor and a first dielectric surface of a dielectric layer, wherein the first dielectric surface is coplanar with the first inductor surface, and wherein a second inductor surface of the first inductor is coplanar with a second dielectric surface of the dielectric layer.

31. The apparatus of claim 30, further comprising:
at least one semiconductor die into which the means for generating the magnetic field and the means for generating the current are integrated; and
mean for conducting including a metal layer positioned between the low-loss substrate and the first inductor.

32. The apparatus of claim 30, further comprising a device selected from a cellular phone, a wireless local area network (LAN) device, a set top box, a music player, a video player, an entertainment unit, a navigation device, a communications device, a personal digital assistant (PDA), a fixed location data unit, and a computer, into which the means for generating the magnetic field and the means for generating the current are integrated.

33. A computer-readable storage device storing instructions that, when executed by a processor cause the processor to perform operations comprising:
forming a first inductor structure including a first inductor;
forming a second inductor structure including a second inductor, wherein the first inductor is positioned between a low-loss substrate and the second inductor, wherein the first inductor is aligned with the second inductor to form a transformer;
forming a sacrificial structure between the first inductor and the second inductor; and
removing the sacrificial structure to form a cavity associated with an air-gap, wherein the air-gap is defined by at least a first inductor surface of the first inductor and a first dielectric surface of a first dielectric layer wherein the first dielectric surface is coplanar with the first inductor surface, and wherein a second inductor surface of the first inductor is coplanar with a second dielectric surface of the first dielectric layer.

34. The computer-readable storage device of claim 33, wherein the second inductor is adjacent to a recess formed in a dielectric material, and wherein the recess extends through a surface defining a portion of the air-gap.

35. The computer-readable storage device of claim 33, wherein the second inductor is formed on the sacrificial structure.

36. The computer-readable storage device of claim 33, wherein the sacrificial structure comprises a sacrificial material, wherein the first dielectric layer is disposed over an entire length of a side surface of the first inductor, and wherein a height of the first inductor is substantially the same as a height of the first dielectric layer.

37. The computer-readable storage device of claim 36, further comprising forming a recess to access the sacrificial material and removing the sacrificial material via the recess.

38. The computer-readable storage device of claim 36, wherein the sacrificial material comprises at least one of molybdenum, amorphous silicon, poly-silicon, silicon dioxide, and SU-8 photoresist.

* * * * *